(12) United States Patent
Kahle et al.

(10) Patent No.: US 8,384,068 B2
(45) Date of Patent: Feb. 26, 2013

(54) USE OF ACRIDINE DERIVATIVES AS MATRIX MATERIALS AND/OR ELECTRON BLOCKERS IN OLEDS

(75) Inventors: Klaus Kahle, Ludwigshafen (DE); Oliver Molt, Hirschberg (DE); Nicolle Langer, Heppenheim (DE); Christian Lennartz, Schifferstadt (DE); Christian Schildknecht, Mannheim (DE); Simon Nord, Roemerberg (DE); Evelyn Fuchs, Mannheim (DE); Jens Rudolph, Worms (DE)

(73) Assignee: BASF SE, Ludwigshafen (DE)

( * ) Notice: Subject to any disclaimer, the term of this patent is extended or adjusted under 35 U.S.C. 154(b) by 300 days.

(21) Appl. No.: 12/681,023

(22) PCT Filed: Sep. 26, 2008

(86) PCT No.: PCT/EP2008/062976
§ 371 (c)(1),
(2), (4) Date: Mar. 31, 2010

(87) PCT Pub. No.: WO2009/047147
PCT Pub. Date: Apr. 16, 2009

(65) Prior Publication Data
US 2010/0219406 A1 Sep. 2, 2010

(30) Foreign Application Priority Data
Oct. 2, 2007 (EP) .................................. 07117770

(51) Int. Cl.
*H01L 51/54* (2006.01)
*H01L 51/52* (2006.01)

(52) U.S. Cl. ........... 257/40; 257/E51.022; 257/E51.026; 546/102

(58) Field of Classification Search ............... 546/102; 257/40, E51.022, E51.026
See application file for complete search history.

(56) References Cited

U.S. PATENT DOCUMENTS

| 2001/0009782 A1 | 7/2001 | Ball et al. |
| 2001/0015432 A1 | 8/2001 | Igarashi |
| 2002/0024293 A1 | 2/2002 | Igarashi et al. |
| 2002/0048689 A1 | 4/2002 | Igarashi et al. |
| 2002/0055014 A1 | 5/2002 | Okada et al. |
| 2002/0094453 A1 | 7/2002 | Takiguchi et al. |
| 2004/0219386 A1 | 11/2004 | Thoms |
| 2007/0247059 A1 | 10/2007 | Cho et al. |
| 2007/0262706 A1 | 11/2007 | Yoon et al. |
| 2008/0093982 A1 | 4/2008 | Cho et al. |
| 2008/0303414 A1 | 12/2008 | Cho et al. |

FOREIGN PATENT DOCUMENTS

| EP | 1 191 612 | 3/2002 |
| EP | 1 191 613 | 3/2002 |
| EP | 1 211 257 | 6/2002 |
| EP | 1 341 403 | 9/2003 |
| EP | 1 840 120 | 10/2007 |
| JP | 06293883 | 10/1994 |
| JP | 07109449 | 4/1995 |
| JP | 08259937 | 10/1996 |
| JP | 09310066 | 12/1997 |
| JP | 10 226785 | 8/1998 |
| JP | 10 338871 | 12/1998 |
| JP | 2001 244076 | 9/2001 |
| JP | 2004171986 | 6/2004 |
| WO | 00 70655 | 11/2000 |
| WO | 01 41512 | 6/2001 |
| WO | 02 02714 | 1/2002 |
| WO | 02 060910 | 8/2002 |
| WO | 02 15645 | 2/2005 |
| WO | 2005 019373 | 3/2005 |
| WO | 2005 113704 | 12/2005 |
| WO | 2005 123873 | 12/2005 |
| WO | 2006 033563 | 3/2006 |
| WO | 2006 056418 | 6/2006 |
| WO | 2006 067074 | 6/2006 |
| WO | 2006 080640 | 8/2006 |
| WO | 2006 103874 | 10/2006 |
| WO | 2006 115301 | 11/2006 |
| WO | 2006 121811 | 11/2006 |
| WO | WO 2007110228 A1 * | 10/2007 |

OTHER PUBLICATIONS

Kosolapoff et al., Journal of the American Chemical Society (1954), vol. 76, p. 1276-8.*
Baldo, M.A. et al., "Very high-efficiency green organic light-emitting devices based on electrophosphorescence", Applied Physics Letters, vol. 75, No. 1, pp. 4-6, Jul. 5, 1999.

* cited by examiner

*Primary Examiner* — Yong Chu
(74) *Attorney, Agent, or Firm* — Oblon, Spivak, McClelland, Maier & Neusadt, L.L.P.

(57) ABSTRACT

The present invention relates to the use of (hetero)aryl-substituted acridine derivatives as matrix materials in a light-emitting layer of organic light-emitting diodes (OLEDs) and/or in a blocking layer for electrons in organic light-emitting diodes. The present invention further relates to a light-emitting layer which comprises at least one emitter material and at least one matrix material, wherein the matrix material used is at least one (hetero)aryl-substituted acridine derivative, and to an organic light-emitting diode which comprises at least one inventive light-emitting layer, to an organic light-emitting diode which comprises at least one acridine derivative of the formula (I) in a blocking layer for electrons, and to a device selected from stationary and mobile visual display units and illumination units which comprise at least one inventive organic light-emitting diode.

11 Claims, No Drawings

USE OF ACRIDINE DERIVATIVES AS MATRIX MATERIALS AND/OR ELECTRON BLOCKERS IN OLEDS

The present invention relates to the use of (hetero)aryl-substituted acridine derivatives as matrix materials in a light-emitting layer of organic light-emitting diodes (OLEDs) and/or as electron blockers in OLEDs. The present invention further relates to a light-emitting layer which comprises at least one emitter material and at least one matrix material, wherein the matrix material used is at least one (hetero)aryl-substituted acridine derivative, and to an organic light-emitting diode which comprises at least one inventive light-emitting layer and/or a blocking layer for electrons which comprises the (hetero)aryl-substituted acridine derivatives according to the present application, and to a device selected from stationary and mobile visual display units and illumination units which comprise at least one inventive organic light-emitting diode.

Organic light-emitting diodes (OLEDs) exploit the property of materials of emitting light when they are excited by electrical current. OLEDs are of particular interest as an alternative to cathode ray tubes and to liquid-crystal displays for producing flat visual display units. Owing to the very compact design and the intrinsically low power consumption, devices comprising OLEDs are suitable especially for mobile applications, for example for applications in cellphones, laptops, digital cameras, and for illumination, etc.

The basic principles of the way in which OLEDs work and suitable structures (layers) of OLEDs are known to those skilled in the art and are specified, for example, in WO 2005/113704 and the literature cited therein. The light-emitting materials (emitters) used may, as well as fluorescent materials (fluorescence emitters), be phosphorescent materials (phosphorescence emitters). The phosphorescence emitters are typically organometallic complexes which, in contrast to the fluorescence emitters which exhibit singlet emission, exhibit triplet emission (triplet emitters) (M. A. Baldow et al., Appl. Phys. Lett. 1999, 75, 4 to 6).

For quantum-mechanical reasons, when the triplet emitters (phosphorescence emitters) are used, up to four times the quantum efficiency, energy efficiency and power efficiency is possible. In order to implement the advantages of the use of the organometallic triplet emitters in practice, it is necessary to provide device compositions which have a high operative lifetime, a high stability to thermal stress and a low use and operating voltage.

Such device compositions may, for example, comprise matrix materials in which the actual light emitter is present in distributed form. In this case, the selection of the matrix material has a significant influence on parameters including the luminance and quantum yields of the OLEDs. The selection of the further layers, for example the blocking layer for electrons, of the OLEDs also has an influence on the performance of the OLEDs, such that it is advisable, for example, to match the blocking layer for electrons to the light emitter.

The prior art proposes numerous different materials for use in OLEDs. Among the proposed materials are also (hetero)aryl-substituted acridine derivatives, and the use of acridine derivatives in various layers of the OLEDs is disclosed.

For instance, US 2004/0219386 A1 relates to the use of heterogeneous spiro compounds in OLEDs, which can be used as a light-emitting layer and/or one or more charge transport layers, or as a host material (matrix material) for one or more of these layers. The overall disclosure in US 2004/0219386 A1 also includes spiro compounds which have acridine units.

JP 2004/171986 A2 relates to OLEDs in which polycyclic compounds are used in the electron transport layer or as a matrix material in the light-emitting layer. The polycyclic compounds are Spiro compounds, almost all example compounds relating to spiro-bifluorenes. However, in one example mentioned, a spirocyclic acridine derivative is disclosed. This acridine derivative is substituted on the nitrogen by a methyl group and has, in the 9 position, an aliphatic spiro linkage to a further acridine derivative. The polycyclic compounds specified in JP 2004/171986 A2 are suitable as a matrix material for triplet emitters.

EP 1 341 403 A1 relates to organic light-emitting diodes which comprise specific spirocyclic organic compounds. The spirocyclic organic compounds may include an acridine derivative which is substituted on the nitrogen atom by a methyl group and, in the 9 position, has a spiro linkage to a fluorenyl radical. The spiro compounds disclosed in EP 1 341 403 A1 are preferably used in the electron transport layer or hole blocking layer.

In addition to the aforementioned spiro compounds, the use of non-spirocyclic acridine derivatives in OLEDs is likewise known in the prior art.

For instance, JP 06-293883 A relates to compounds which, in their light-emitting layer, have tricyclic organic compounds. According to the general definition in JP 06-293883 A, the compounds may be acridine derivatives. However, JP 06-293883 A does not disclose any examples of suitable acridine derivatives, but rather only acridone derivatives.

JP 07-109449 A relates to the use of compounds with a tricyclic base skeleton in OLEDs. The compounds disclosed in JP 07-109449 A have the same base structure as the compounds disclosed in JP 06-293883 A. According to JP 07-109449 A, they are used in the light-emitting layer. Although the base structure disclosed in JP 07-109449 A also comprises acridine derivatives, no examples of suitable acridine derivatives are disclosed, but rather only examples of acridone derivatives.

JP 08-259937 A relates to an electron transport material for OLEDs, which may include an acridine derivative 9-substituted by two triaryl radicals. The use of the compounds disclosed in JP 08-259937 A as matrix materials is not disclosed in JP 08-259937 A.

JP 10-338871 A relates to the use of the compounds already disclosed in JP 08-259937 A in the light-emitting layer as an electroluminescent material. The use of the acridine derivatives disclosed in JP 10-338871 A as a matrix material is not disclosed in JP 10-338871.

JP 09-310066 A relates to specific amine compounds which can be used in the hole transport layer of an OLED. The amine compounds according to JP 09-310066A may be acridine derivatives. The acridine derivatives disclosed in JP 09-310066 A bear, in their 9 position, alkyl radicals, for example methyl groups.

JP 10-226785 A relates to the use of specific triarylamine compounds as hole injection or hole transport materials in organic light-emitting diodes. According to JP 10-226785 A, the triarylamine compounds can be added to the light-emitting layer or another layer (hole injection layer or hole transport layer) of the OLED. The triarylamine compounds according to JP 10-226785 A may include acridine derivatives which bear alkyl radicals in the 9 position, for example methyl radicals.

JP 2001-244076 A relates, inter alia, to the use of bisacridine derivatives bonded via an aryl group in organic light-emitting diodes. The acridine derivatives specified in JP 2001-244076 A can be used, inter alia, as a matrix material in the light-emitting layer. However, JP 2001-244076 A does not mention any specific acridine derivatives (but rather only acridone derivatives).

In order that OLEDs with particularly good properties can be provided, it is necessary to optimize the materials used in the OLEDs. It is advisable, inter alia, to match the matrix materials used in the light-emitting layer or the materials used in a blocking layer for electrons to the emitter material used. It is therefore an object of the present application to provide novel matrix materials for use in the light-emitting layer in OLEDs, and electron blockers for use in OLEDs, which preferably serve as matrix materials and/or electron blockers for triplet emitters. The matrix materials and electron blockers should be easily obtainable and, in combination with the actual emitter(s), bring about good luminances and quantum yields in OLEDs.

This object is achieved by the use of acridine derivatives of the general formula (I) as matrix materials in a light-emitting layer and/or as electron blockers in an organic light-emitting diode

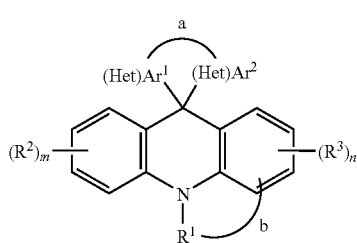

(I)

in which:
(Het)Ar$^1$,
(Het)Ar$^2$ are each independently an unsubstituted or substituted aryl radical or an unsubstituted or substituted heteroaryl radical;
R$^1$ is an unsubstituted or substituted alkyl radical which may be linear or branched, an unsubstituted or substituted cycloalkyl radical, an unsubstituted or substituted heterocycloalkyl radical, an unsubstituted or substituted aryl radical, an unsubstituted or substituted heteroaryl radical;
R$^2$, R$^3$ are each independently an unsubstituted or substituted alkyl radical which may be linear or branched, an unsubstituted or substituted cycloalkyl radical, an unsubstituted or substituted heterocycloalkyl radical, an unsubstituted or substituted aryl radical, an unsubstituted or substituted heteroaryl radical, or a silyl radical;
n, m are each independently 0, 1, 2, 3 or 4, where, in the case that n or m is 0, all positions in the acridine base skeleton substitutable by R$^2$ or R$^3$ are hydrogen;

is an optional bridge composed of 0, 1 or 2 atoms which bonds the (Het)Ar$^1$ and (Het)Ar$^2$ groups covalently to one another;

is an optional bridge composed of 0, 1 or 2 atoms which bonds the R$^1$ radical covalently to one of the substitutable carbon atoms of the acridine skeleton.

The compounds of the formula (I) used in accordance with the invention are used in the light-emitting layer of an OLED together with the actual emitter. The emitter which is used together with the matrix materials of the formula (I) in the light-emitting layer of an OLED is preferably a triplet emitter. In addition, the compounds of the formula (I) can be used in a blocking layer for electrons, which is preferably directly adjacent (in direct contact) to the emitter layer in the OLEDs. The emitter in this case too is preferably a triplet emitter.

The present invention therefore further provides for the use of the acridine derivatives of the formula (I) as matrix materials for triplet emitters.

In addition, the present invention further provides for the use of the acridine derivatives of the formula (I) in a blocking layer for electrons, the blocking layer for electrons being present in an OLED and being in direct contact to the emitter layer of the OLED, and the emitter layer comprising a triplet emitter. The present invention therefore further provides for the use of the acridine derivatives of the formula (I) as electron blockers for triplet emitters.

The acridine derivatives of the formula (I) are notable especially in that, in combination with the actual emitter(s), in the form of matrix material and/or in the form of electron blockers, they have good luminances and quantum yields when used in the emitter layer of OLEDs. In addition, acridine derivatives of the formula (I) are readily evaporable and form stable amorphous films. They can also readily be matched synthetically to the emitter used.

What is important for the use of organic compounds as matrix materials and/or electron blockers, especially for triplet emitters, in organic light-emitting diodes is the energy of the lowest triplet state. In the acridine derivatives of the formula (I) used in accordance with the invention, it is generally at least 2.6 eV; preferably, the energy of the lowest triplet state is from 2.6 to 3.3 eV, more preferably from 2.7 to 3.0 eV. The energy of the lowest triplet state is defined as the shortest-wavelength peak of triplet emission.

The aforementioned (Het)Ar$^1$, (Het)Ar$^2$, R$^1$, R$^2$ and R$^3$ radicals and the aforementioned optional bridges may be unsubstituted or substituted. In the case that the aforementioned groups are unsubstituted, all substitutable positions are occupied by hydrogen atoms. In the case that the aforementioned groups are substituted, the groups may independently bear one or more substituents, the maximum number of substituents arising from the number of substitutable positions in the particular aforementioned groups. Preferred embodiments with regard to the substitution of the aforementioned radicals are specified below.

Suitable substituents are alkyl radicals, which may be linear or branched, cycloalkyl radicals, heterocycloalkyl radicals, alkoxy radicals, cyano groups, aryl- or heteroarylcarbonyloxy, alkylcarbonyloxy, silyl radicals, aryl radicals or heteroaryl radicals. Preferred alkyl, alkoxy, cycloalkyl, heterocycloalkyl, silyl, aryl and heteroaryl radicals are specified below.

Particular preference is given to using the following radicals as substituents: C$_1$- to C$_8$-alkyl radicals which may be linear or branched, preferably C$_1$- to C$_4$-alkyl radicals which may be linear or branched, more preferably methyl, ethyl, n-propyl, isopropyl, n-butyl, isobutyl, sec-butyl or tert-butyl. The alkyl radicals may be unsubstituted or substituted, suitable substituents preferably being selected from the group consisting of aryl, alkoxy, aryloxy and halogen. Examples of substituted alkyl radicals suitable as substituents are CF$_3$, phenoxymethyl and benzyl. Further preferred substituents are $C_6$- to $C_{14}$-aryl radicals which may in turn be substituted by the substituents specified for the alkyl radicals or unsubstituted, for example phenyl or biphenyl. Further preferentially suitable substituents are heteroaryl radicals having from 5 to 14 ring atoms, which may in turn be substituted by the substituents specified above for the alkyl radicals or be unsubstituted. Preferred heteroaryl radicals are pyridyl, pyrimidyl, triazinyl, oxadiazolyl, benzofuryl, dibenzofuryl, benzothienyl, dibenzothienyl, carbazolyl which may be bonded to the acridine base skeleton via the nitrogen atom or via one of its carbon atoms, acridyl which may be bonded to the acridine base skeleton via the nitrogen atom or via one of its carbon atoms, phenothiazine S,S-dioxidyl which may be bonded to the acridine base skeleton via the nitrogen atom or via one of its carbon atoms, and optionally substituted imidazoles and benzimidazoles which may be bonded via N or C. Further preferentially suitable substituents are alkoxy substituents, preferred alkyl radicals of the alkoxy substituents already having been specified above among the alkyl radicals suitable as substituents. Particular preference is given to using $OCH_3$ as the alkoxy substituent. Further preferred substituents are aryl- and heteroarylcarbonyloxy, suitable aryl radicals and heteroaryl radicals corresponding to the aryl radicals and heteroaryl radicals specified above as substituents. Further radicals preferentially suitable as substituents are CN groups and silyl groups. The radicals specified as substituents may themselves in turn bear one or more substituents selected from the aforementioned group. For example, the carbazolyl radicals mentioned may be substituted by silyl groups.

As already mentioned above, the alkyl radicals and the alkyl radicals of the alkoxy groups, according to the present application, may be either straight-chain or branched and have preferably from 1 to 8 carbon atoms, more preferably from 1 to 4 carbon atoms. Most preferably, the alkyl radicals are methyl, ethyl, n-propyl, isopropyl, n-butyl, isobutyl, sec-butyl or tert-butyl. The alkyl radicals may be unsubstituted or substituted, preferred substituents being selected from the group consisting of aryl, alkoxy and halogen. Further suitable substituents of the alkyl radicals are specified above. Examples of suitable substituted alkyl radicals are $CF_3$, benzyl and phenoxymethyl.

The cycloalkyl radicals according to the present application are preferably $C_3$- to $C_{14}$-cycloalkyl radicals, i.e. cycloalkyl radicals which have from 3 to 14 carbon atoms in their ring skeleton. Particular preference is given to $C_3$- to $C_{13}$-cycloalkyl radicals. The cycloalkyl radicals may be mono-, bi- or polycyclic. The cycloalkyl radicals are preferably mono- or bicyclic cycloalkyl radicals, more preferably monocyclic cycloalkyl radicals. As already mentioned above, the cycloalkyl radicals may be substituted or unsubstituted. Suitable substituents are preferably selected from the group consisting of aryl, alkoxy and halogen. Further preferentially suitable substituents have already been specified above. Examples of suitable cycloalkyl radicals are monocyclic cycloalkyl radicals such as cyclopropyl, cyclobutyl, cyclopentyl, cyclohexyl, cycloheptyl, cyclooctyl, cyclononyl and cyclodecyl, and also polycyclic cycloalkyl radicals such as decalinyl, norbornanyl, bornanyl or adamantyl.

Heterocycloalkyl radicals are understood to mean radicals which differ from the aforementioned cycloalkyl radicals in that at least one carbon atom in the cyclic alkyl base skeleton is replaced by a heteroatom. Preferred heteroatoms are N, O and S. The heterocycloalkyl base skeleton may—like the cycloalkyl base skeleton—be substituted at one, more than one or all substitutable positions, suitable substituents being the same as have already been specified under the definition of cycloalkyl. The number of ring atoms likewise corresponds to the number of carbon atoms specified for the cycloalkyl radicals. Preferred heterocycloalkyl radicals are nitrogen-containing radicals such as pyrrolidin-2-yl, pyrrolidin-3-yl, piperidin-2-yl, piperidin-3-yl, piperidin-4-yl.

Suitable halogen substituents are fluorine, chlorine, bromine and iodine, preferably fluorine, chlorine and bromine, more preferably fluorine and chlorine, very particular preference being given to fluorine.

Suitable alkoxy groups derive from the corresponding alkyl radicals as have been defined above. Examples of suitable alkoxy groups are $OCH_3$, $OC_2H_5$, $OC_3H_7$ and $OC_4H_9$. $C_3H_7$ and $C_4H_9$ are understood to mean both the n-isomers and the branched isomers such as isopropyl, isobutyl, sec-butyl and tert-butyl.

In the present application, aryl refers to radicals which are derived from mono- or polycyclic aromatics, preferably mono-, bi- or tricyclic aromatics, more preferably mono- or bicyclic aromatics, and do not comprise any ring heteroatoms. When aryl is not a monocyclic system, the saturated form (perhydro form) or the partly unsaturated form (for example dihydro form or tetrahydro form), provided that the particular forms are known and stable, is also possible for the second or further ring. This means that the term "aryl" in the present application also comprises, for example, bicyclic radicals in which either both radicals are aromatic or bicyclic radicals in which only one ring is aromatic. Examples of suitable aryl radicals are: phenyl, naphthyl, indanyl, 1,2-dihydronaphthenyl, 1,4-dihydronaphthenyl, indenyl or 1,2,3,4-tetrahydronaphthyl. Particular preference is given to phenyl or naphthyl, very particular preference to phenyl.

The aryl radicals may be unsubstituted or substituted by one or more further radicals. Suitable further radicals are selected from the group consisting of alkyl, aryl, alkoxy, aryloxy, arylcarbonyloxy, heteroaryl, hydroxyl, amino and halogen. Preferred alkyl, aryl, alkoxy and halogen radicals and suitable further substituents have already been specified above. The substitution of the aryl radicals depends, among other factors, on their position in the acridine base skeleton of the formula (I). Further aryl radicals substituted according to their position are thus specified below with regard to the definitions of the individual substituents on the acridine base skeleton of the formula (I).

Suitable aryloxy and arylcarbonyloxy groups derive from the corresponding aryl radicals as have been defined above. Particular preference is given to phenoxy and phenylcarbonyloxy.

Suitable amino groups have the general formula —NR'R" where R' and R" are each aryl. Suitable aryl radicals, each of which may optionally be substituted, are specified above. Examples of suitable amino groups are diarylamino groups such as diphenylamino.

Heteroaryl is understood to mean mono-, bi- or polycyclic heteroaromatic groups, preferably mono-, bi- or tricyclic heteroaromatic groups, which derive partly from the aforementioned aryl, in which at least one carbon atom in the aryl base skeleton is replaced by a heteroatom. Preferred heteroatoms are N, O and S. Preferred monocyclic heteroaryl radicals are derived from pyridine, pyrimidine and triazine, where the nitrogen atoms in the pyrimidine and triazine radicals may be arranged as desired, pyrrole, furan, thiophene, imidazole and oxadiazole. The base skeleton may be substituted at one, more than one or all substitutable positions, suitable substituents being the substituents specified with regard to the definition of aryl. In addition, the monocyclic heteroaryl base skeleton may be fused to one or two aryl groups to form bi- or tricyclic heteroaryl radicals. Suitable bi- or tricyclic heteroaryl radicals are benzofuryl, dibenzofuryl, benzothienyl, dibenzothienyl, carbazolyl, benzimidazolyl, phenothiazine S,S-dioxidyl, acridyl, where the carbazolyl, phenothiazine S,S-dioxidyl and acridyl radicals may be bonded either via the nitrogen atom or via one of the carbon atoms of the corresponding radicals. Particularly preferred heteroaryl substituents depend on the position of the substituents on the acridyl base skeleton of the formula (I) and are specified below with regard to the definitions of the individual radicals of the acridyl base skeleton of the formula (I).

In the context of the present application, silyl radicals are understood to mean arylsilyl radicals, arylalkylsilyl radicals and alkylsilyl radicals, suitable aryl and alkyl groups having been specified above. Preferred aryl groups in the silyl radicals are $C_6$-aryl radicals, which may be substituted or unsubstituted; particular preference is given to unsubstituted phenyl radicals. Preferred alkyl groups are $C_1$-$C_6$-alkyl radicals, more preferably $C_1$-$C_4$-alkyl radicals, more preferably methyl or ethyl radicals and most preferably methyl radicals. Examples of preferred silyl radicals are triphenylsilyl, diphenylmethylsilyl, trimethylsilyl and phenyldimethylsilyl.

The $R^1$ radical is an unsubstituted or substituted alkyl radical which may be linear or branched, an unsubstituted or substituted cycloalkyl radical, an unsubstituted or substituted heterocycloalkyl radical, an unsubstituted or substituted aryl radical or an unsubstituted or substituted heteroaryl radical. Suitable and preferred alkyl radicals, cycloalkyl radicals, heterocycloalkyl radicals, aryl radicals, heteroaryl radicals, and suitable substituents, have already been specified above. The $R^1$ radical is preferably an unsubstituted or substituted $C_1$- to $C_8$-alkyl radical which may be linear or branched, more preferably an unsubstituted $C_1$- to $C_4$-alkyl radical which may be linear or branched; an unsubstituted or substituted $C_6$- to $C_{14}$-aryl radical, more preferably an unsubstituted or substituted phenyl radical or an unsubstituted or substituted biphenyl radical; an unsubstituted or substituted heteroaryl radical having from 5 to 14 ring atoms, more preferably an unsubstituted or substituted pyridyl radical, an unsubstituted or substituted pyrimidyl radical, an unsubstituted or substituted benzofuryl radical, an unsubstituted or substituted dibenzofuryl radical, an unsubstituted or substituted benzothienyl radical, an unsubstituted or substituted dibenzothienyl radical, an unsubstituted or substituted carbazolyl radical or an unsubstituted or substituted triazine radical. In a preferred embodiment, the $R^1$ radical is an unsubstituted or substituted aryl radical, preferred aryl radicals having been specified above and suitable examples of aryl radicals $R^1$ being specified below. Suitable substituents of the aforementioned preferred radicals have already been specified above. Examples of suitable $R^1$ radicals are methyl, ethyl, n-propyl, isopropyl, n-butyl, isobutyl, sec-butyl, tert-butyl and radicals of the following general formulae

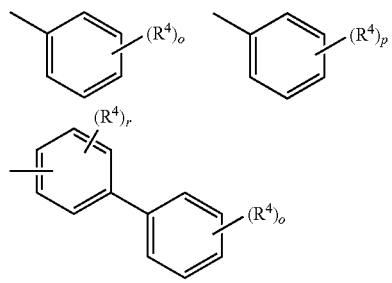

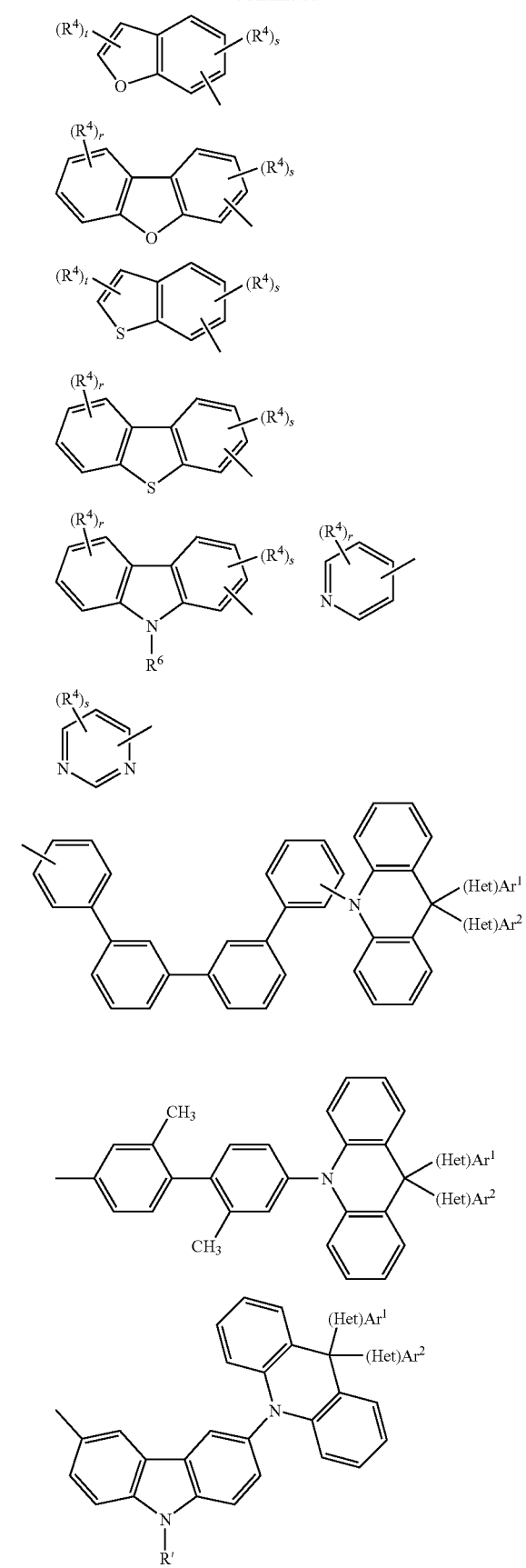

-continued

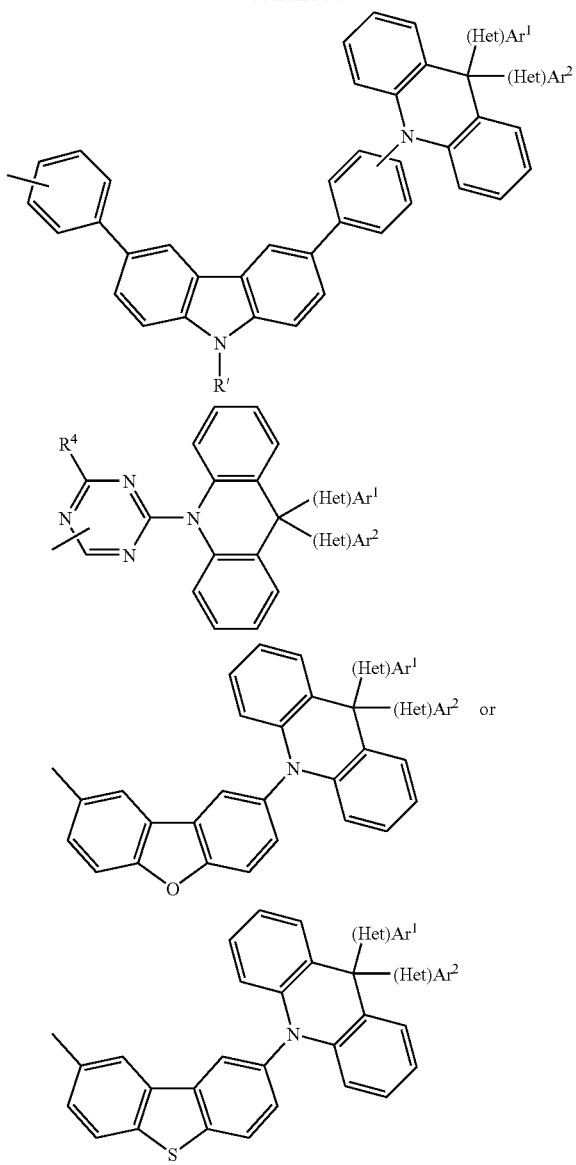

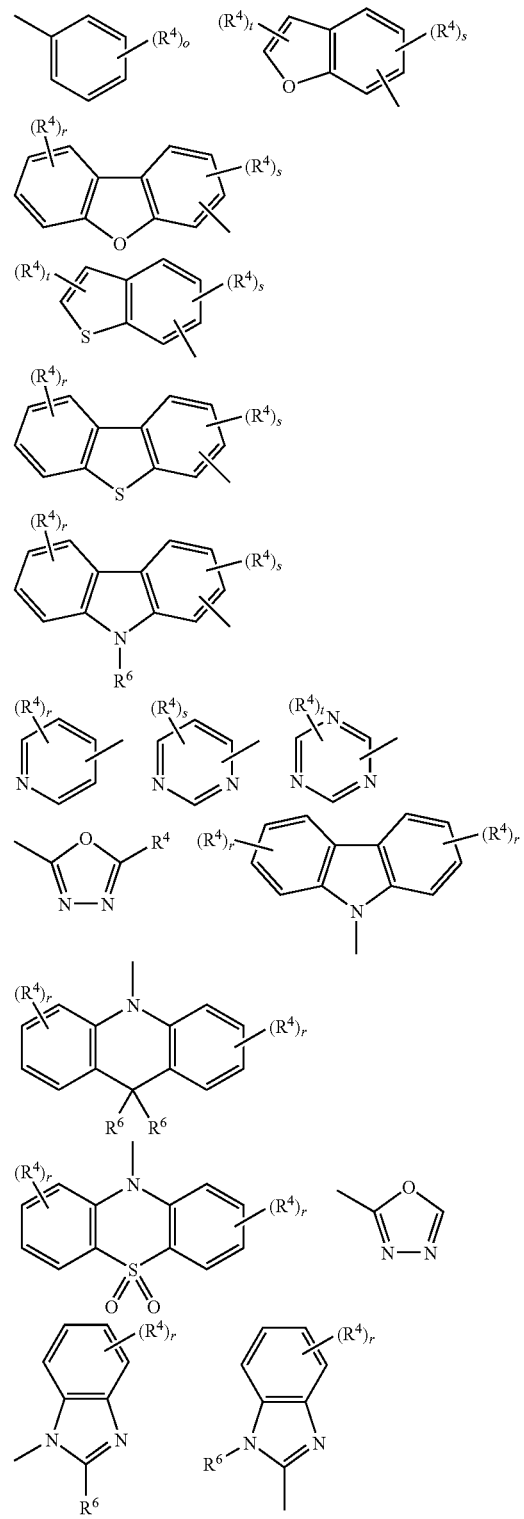

in which:

R⁴ is a substituent selected from the group consisting of alkyl, aryl, heteroaryl, alkoxy, aryloxy, arylcarbonyloxy, silyl and halogen, preferred alkyl, aryl, heteroaryl, alkoxy, aryloxy, aryloxycarbonyloxy, silyl and halogen groups having been specified above. Very particularly preferred R⁴ radicals are methyl, methoxy, CF₃, CN, silyl (preferably triphenylsilyl, diphenylmethylsilyl, phenyldimethylsilyl).

R⁵ is alkyl which may be substituted or unsubstituted and branched or unbranched, preferably $C_1$- to $C_8$-alkyl, more preferably $C_1$- to $C_4$-alkyl, most preferably methyl, ethyl, n-propyl, isopropyl, n-butyl, isobutyl, sec-butyl, tert-butyl, especially preferably methyl, CF₃; alkoxy, preferably $C_1$- to $C_4$-alkoxy, more preferably methoxy; cyano; silyl; arylcarbonyloxy, preferably phenylcarbonyloxy, heteroarylcarbonyloxy, preferred heteroaryl groups having been specified above, or a radical of the formulae specified below:

R⁶ is hydrogen, alkyl, cycloalkyl, aryl or heteroaryl, suitable alkyl, cycloalkyl, aryl and heteroaryl radicals having been specified above;

R' is an unsubstituted or substituted alkyl radical which may be linear or branched, an unsubstituted or substituted cycloalkyl radical, an unsubstituted or substituted heterocycloalkyl radical, an unsubstituted or substituted aryl radical, an unsubstituted or substituted heteroaryl radical, suitable alkyl, cycloalkyl, aryl and heteroaryl radicals having been specified above;

o, p are each 0, 1, 2, 3, 4, 5, preferably 0, 1, 2, 3, more preferably 0 or 1, r is 0, 1, 2, 3, 4, preferably 0, 1 or 2, more preferably 0 or 1;

s is 0, 1, 2, 3, preferably 0 or 1;

t is 0, 1, 2, preferably 2;

where, in the cases in which o, p, r, s or t is 0, the aforementioned base skeletons bear hydrogen atoms at their substitutable positions and (Het)Ar¹ and (Het)Ar² are each as defined below.

In a preferred embodiment, in the R¹ radical and in the (Het)Ar¹ and (Het)Ar² radicals specified below, o, r and s are each 0, t is 2 and p is 1.

(Het)Ar¹ and (Het)Ar² are each independently an unsubstituted or substituted aryl radical or an unsubstituted or substituted heteroaryl radical. The (Het)Ar¹ and (Het)Ar² radicals are preferably each independently selected from the group consisting of unsubstituted and substituted $C_6$-$C_{14}$-aryl radicals, preferably unsubstituted and substituted phenyl and unsubstituted and substituted biphenyl; and unsubstituted and substituted heteroaryl radicals having from 5 to 14 ring atoms, preferably unsubstituted and substituted pyridyl, unsubstituted and substituted pyrimidyl, unsubstituted and substituted triazinyl, unsubstituted and substituted benzofuryl, unsubstituted and substituted benzothienyl, unsubstituted and substituted benzimidazolyl, unsubstituted and substituted dibenzofuryl, unsubstituted and substituted dibenzothienyl and unsubstituted and substituted carbazolyl, where the carbazolyl radical may be bonded to the acridine base skeleton of the formula (I) via the nitrogen atom or via one of its carbon atoms. Suitable substituents of the aforementioned (Het)Ar¹ and (Het)Ar² radicals specified above have already been specified above.

Particularly preferred (Het)Ar¹ and (Het)Ar² radicals are each independently selected from the radicals shown below:

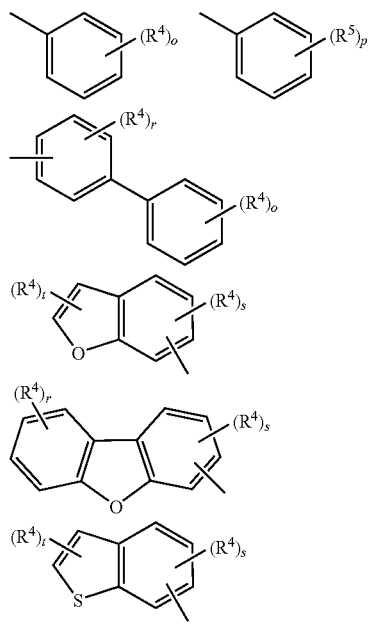

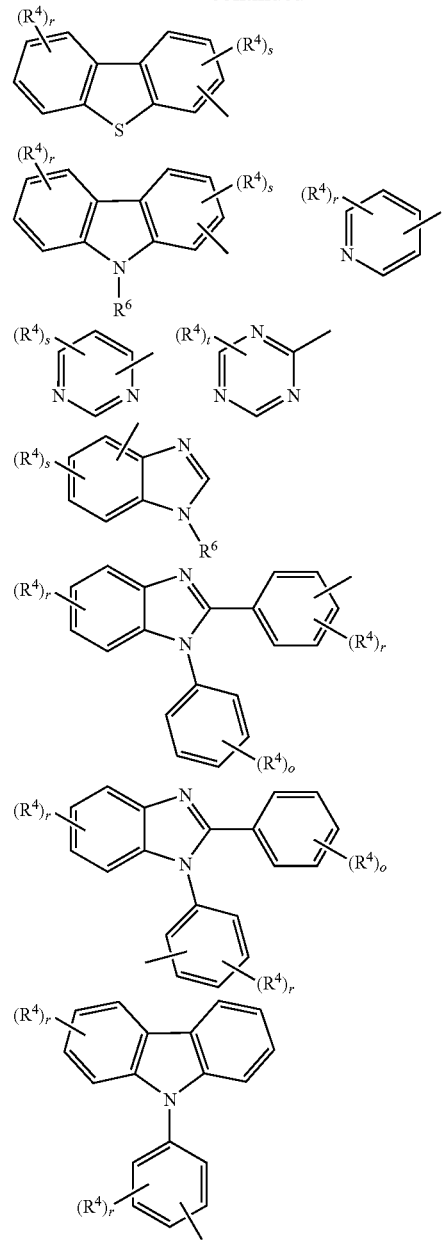

where the R⁴, R⁵ and R⁶ radicals and the indices o, p, r, s and t are each defined as specified above for the R¹ radicals.

In a particularly preferred embodiment of the present invention, the (Het)Ar¹ and (Het)Ar² groups in the acridine derivatives of the formula (I) are identical.

R² and R³ in the acridine derivatives of the formula (I) are each independently an unsubstituted or substituted alkyl radical which may be linear or branched, an unsubstituted or substituted cycloalkyl radical, an unsubstituted or substituted heterocycloalkyl radical, an unsubstituted or substituted aryl radical or an unsubstituted or substituted heteroaryl radical, and also a silyl radical. Suitable alkyl radicals, cycloalkyl radicals, heterocycloalkyl radicals, aryl radicals and heteroaryl radicals have been specified above. Suitable substituents have likewise already been specified above. Preferably, R² and R³ are each independently an unsubstituted or substituted alkyl radical which may be linear or branched, an unsubstituted or substituted aryl radical or an unsubstituted or substituted heteroaryl radical. More preferably $R^2$ and $R^3$ are each independently $C_1$- to $C_8$-alkyl which may be unsubstituted or substituted and linear or branched, preferably $C_1$- to $C_4$-alkyl which may be linear or branched and is unsubstituted, for example methyl, ethyl, n-propyl, isopropyl, n-butyl, isobutyl, sec-butyl, tert-butyl; unsubstituted or substituted $C_6$- to $C_{14}$-aryl, preferably unsubstituted or substituted phenyl, more preferably unsubstituted phenyl; unsubstituted or substituted heteroaryl having from 5 to 14 ring atoms, preferably unsubstituted or substituted pyridyl, unsubstituted or substituted carbazolyl, more preferably unsubstituted pyridyl, unsubstituted carbazolyl or carbazolyl substituted by $C_1$- to $C_5$-alkyl radicals and/or silyl radicals, or silyl, preferably triphenylsilyl, diphenylmethylsilyl, phenyldimethylsilyl.

n and m in the acridine derivatives of the general formula (I) are each independently 0, 1, 2, 3 or 4, where, in the case that n or m is 0, all positions substitutable by $R^2$ and $R^3$ in the acridine skeleton are hydrogen. n and m are preferably each independently 0, 1 or 2, more preferably 0 or 1, most preferably 0.

The symbol

in the acridine derivatives of the formula (I) represents an optional bridge composed of 0, 1 or 2 atoms which covalently bonds the (Het)Ar$^1$ and (Het)Ar$^2$ groups to one another. In this case, a bridge composed of 0 atoms means that a direct bond is formed between the (Het)Ar$^1$ and (Het)Ar$^2$ groups. The atoms which form the bridge may be carbon atoms or heteroatoms, for example O, N or S. When the bridge comprises more than one atom, the atoms may be either carbon atoms or heteroatoms, such that both bridges which are formed from pure carbon atom chains (alkylene bridge) and bridges which, as well as carbon atoms, have heteroatoms (heteroalkylene bridge) are comprised. The carbon atoms or optionally the heteroatoms, for example N, may be substituted by hydrogen atoms, alkyl radicals, for example $C_1$- to $C_4$-alkyl radicals, preferably methyl; or aryl radicals, e.g. $C_6$- to $C_{14}$-aryl radicals, preferably phenyl. In addition, the bridge may be an alkenylene group when the bridge has at least two carbon atoms. This alkenylene group may likewise be substituted by hydrogen or the aforementioned radicals. Preference is given to a bridge which has 0 or 1 atom, and a bridge composed of 1 atom optionally has a heteroatom. The bridge is more preferably formed from carbon atoms or a bond; very particular preference is given to a bridge formed from one or more carbon atom(s).

The acridine derivative of the general formula (I) may additionally have an optional bridge

which has 0, 1 or 2, preferably 0 or 1 and most preferably 1 atom(s), and which bonds the $R^1$ radical covalently to one of the substitutable carbon atoms of the acridine skeleton. Suitable bridges are the bridges mentioned for the

bridge.

In a preferred embodiment, the acridine derivatives of the general formula (I) have no

bridge, i.e. the acridine derivatives of the formula (I) are more preferably not spiro compounds. It has been found that acridine derivatives of the formula (I) which are not Spiro compounds have a good stability of the amorphous state in operation of an OLED.

The stability of the amorphous state is an important criterion for the use in OLEDs suitable matrix materials. The thermal stress during the operation of an OLED can lead to a transition of the metastable amorphous state to the thermodynamically stable crystal. This has far-reaching consequences for the lifetime of the component. The grain boundaries of individual crystals constitute defect sites at which the transport of charge carriers comes to a standstill. Likewise, the restructuring of the layers associated with the crystallization leads to reduced contact of the layers with one another and with the electrodes. In the course of operation, this ultimately leads with time to the destruction of the OLED. It is known that the stability of the amorphous state in spiro compounds is particularly high. It has been found that acridine derivatives of the formula (I) which are not Spiro compounds, i.e. in which

is not present, have a good stability of the amorphous state and are thus very suitable for use as matrix materials and/or electron blocker materials in OLEDs.

In a further preferred embodiment of the present invention, the acridine derivatives of the formula (I) have neither a

bridge nor a

bridge.

In a further preferred embodiment, the present invention relates to acridine derivatives of the general formula (I) in which the radicals and symbols are each independently defined as follows:

(Het)Ar$^1$,
(Het)Ar$^2$ are each independently selected from the group consisting of unsubstituted and substituted $C_6$-$C_{14}$-aryl radicals and unsubstituted and substituted heteroaryl radicals having from 5 to 14 ring atoms, preferably selected from the group consisting of unsubstituted and substituted phenyl, unsubstituted and substituted biphenyl, unsubstituted and substituted pyridyl, unsubstituted and substituted pyrimidyl, unsubstituted and substituted triazinyl, unsubstituted and substituted benzofuryl, unsubstituted and substituted benzimidazolyl, unsubstituted and substituted benzothienyl, unsubstituted and substituted dibenzofuryl, unsubstituted and substituted dibenzothienyl and unsubstituted and substituted carbazolyl, more preferably phenyl which is unsubstituted or substituted by one or more radicals selected from the group consisting of CN, phenylcarbonyloxy, carbazolyl which may be bonded to the acridine base skeleton via the nitrogen atom or via a carbon atom, pyridyl, $CF_3$,

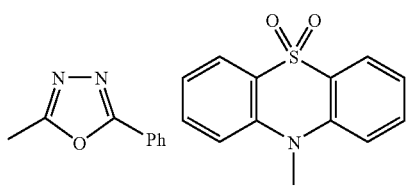

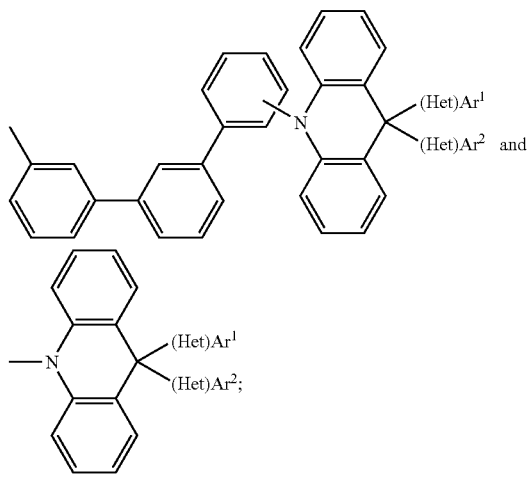

biphenyl, benzofuryl or a radical of the formulae

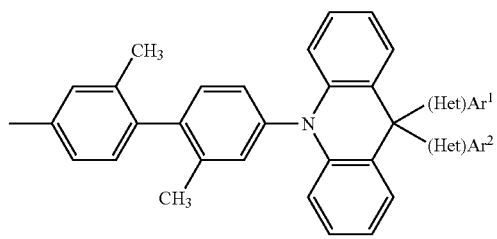

pyridyl, pyrimidyl, triazinyl, oxazolyl, oxadiazolyl, each of which is unsubstituted or substituted by phenyl; benzimidazolyl which is unsubstituted or substituted by phenyl; benzofuryl, dibenzofuryl, benzothienyl, dibenzothienyl and carbazolyl, each of which is unsubstituted or substituted by phenyl;

$R^1$ is an unsubstituted or substituted $C_1$-$C_8$-alkyl radical which may be linear or branched, preferably an unsubstituted $C_1$- to $C_4$-alkyl radical which may be linear or branched; an unsubstituted or substituted $C_6$- to $C_{14}$-aryl radical, preferably an unsubstituted or substituted phenyl radical or an unsubstituted or substituted biphenyl radical; an unsubstituted or substituted heteroaryl radical having from 5 to 14 ring atoms, preferably an unsubstituted or substituted pyridyl radical, an unsubstituted or substituted pyrimidyl radical, an unsubstituted or substituted benzofuryl radical, an unsubstituted or substituted benzothienyl radical, an unsubstituted or substituted dibenzofuryl radical, an unsubstituted or substituted dibenzothienyl radical or an unsubstituted or substituted carbazolyl radical which may be bonded to the acridine base skeleton of the formula (I) via the nitrogen atom or via a carbon atom;

more preferably, $R^1$ is phenyl which is unsubstituted or substitutable by one or more radicals selected from $CH_3$, CN, $OCH_3$, carbazolyl which may be bonded to the acridine base skeleton of the formula (I) via the nitrogen atom or via a carbon atom,

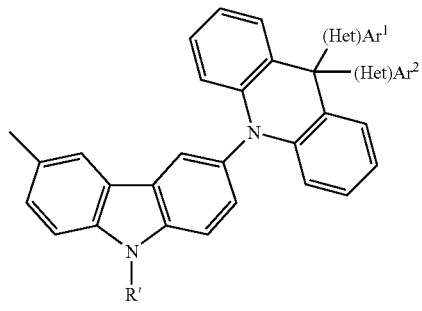

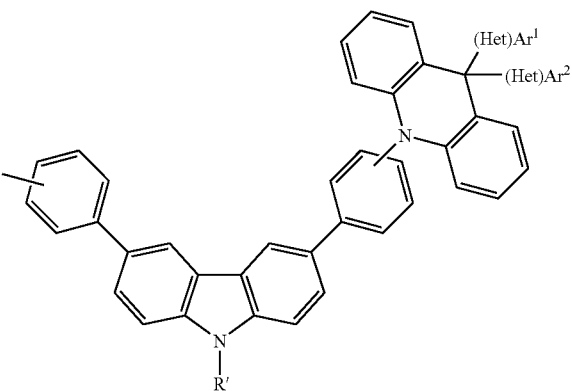

-continued

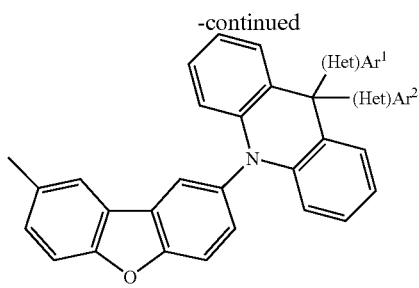

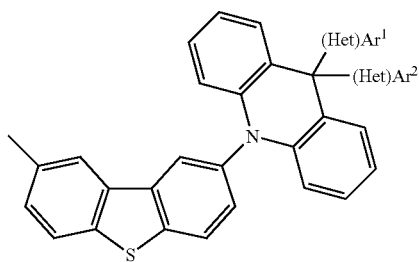

where (Het)Ar¹ and (Het)Ar² are each as defined above, and

R' is an unsubstituted or substituted alkyl radical which may be linear or branched, an unsubstituted or substituted cycloalkyl radical, an unsubstituted or substituted heterocycloalkyl radical, an unsubstituted or substituted aryl radical, an unsubstituted or substituted heteroaryl radical;

most preferably, $R^1$ is phenyl which is unsubstituted or substituted by one or more of the aforementioned radicals, $R^2$, $R^3$ are each independently an unsubstituted or substituted $C_1$-$C_8$-alkyl radical which may be linear or branched, preferably an unsubstituted $C_1$-$C_4$-alkyl radical; an unsubstituted or substituted $C_6$- to $C_{14}$-aryl radical, preferably an unsubstituted or substituted phenyl radical or an unsubstituted or substituted biphenyl radical; an unsubstituted or substituted heteroaryl radical having from 5 to 14 ring atoms, preferably an unsubstituted or substituted pyridyl radical, preferably an unsubstituted or substituted carbazolyl radical or a silyl radical, preferably triphenylsilyl, diphenylmethylsilyl, phenyldimethylsilyl; in a particularly preferred embodiment, the acridine derivatives of the formula (I) each have no or each have one $R^2$ or $R^3$ radical (m, m=0, 1), where, when n and m=1, the $R^2$ and $R^3$ radicals are each arranged in the para position to the nitrogen atom of the acridine derivatives of the formula (I);

n, m are each 0, 1, 2 or 3, preferably 0 or 1, more preferably 0;

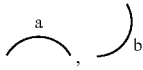

are not present.

Suitable substituents and further preferred suitable alkyl radicals, aryl radicals and heteroaryl radicals have been specified above.

Particularly preferred acridine derivatives of the formula (I) have the following formulae:

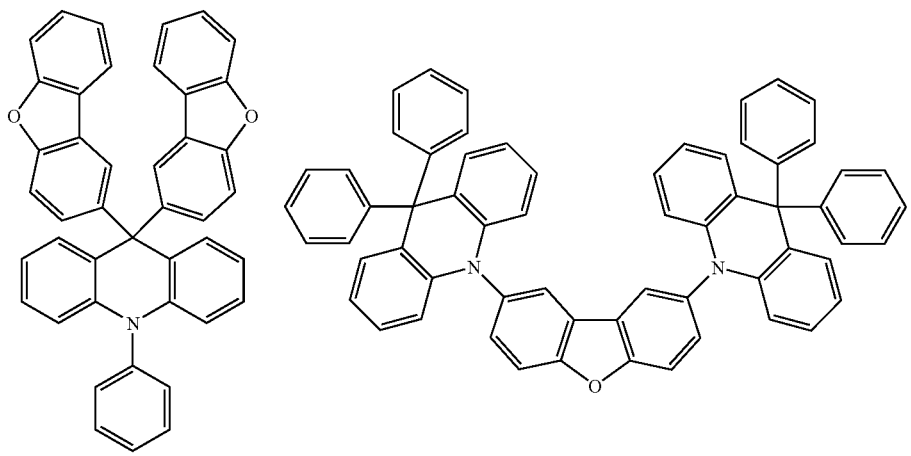

-continued
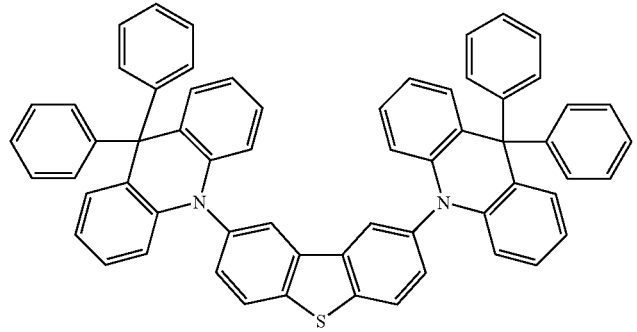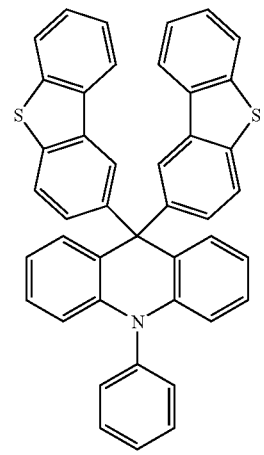
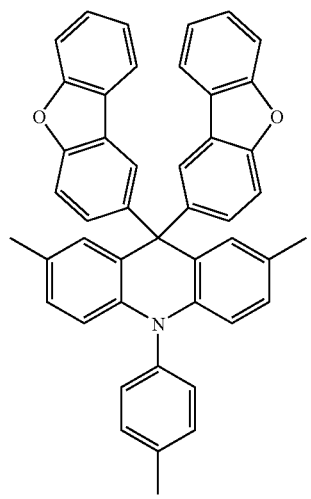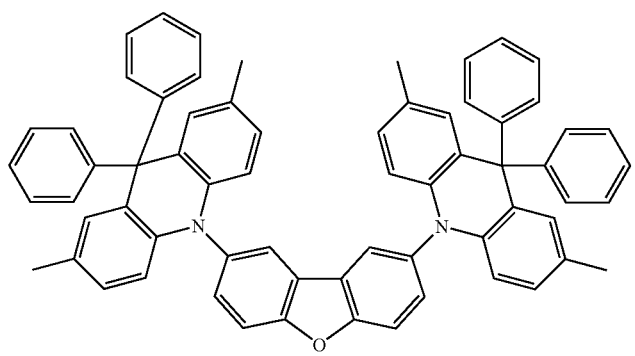
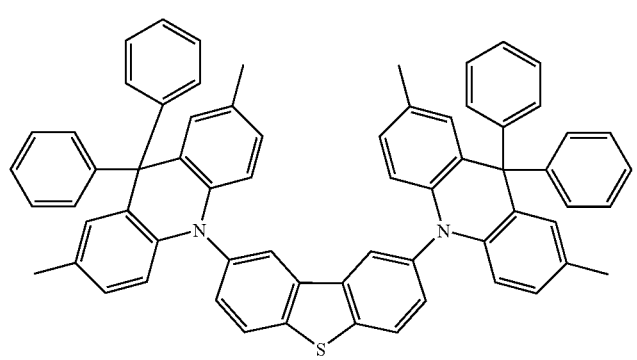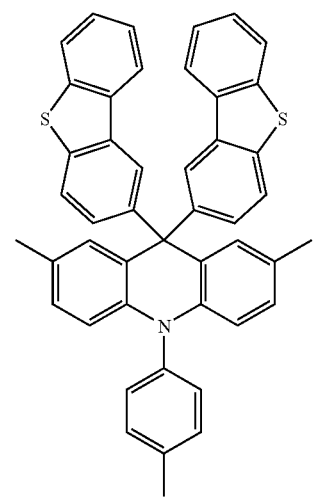

-continued
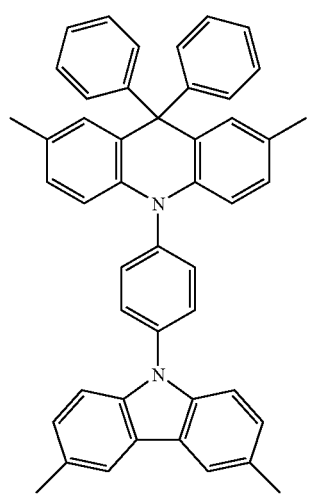
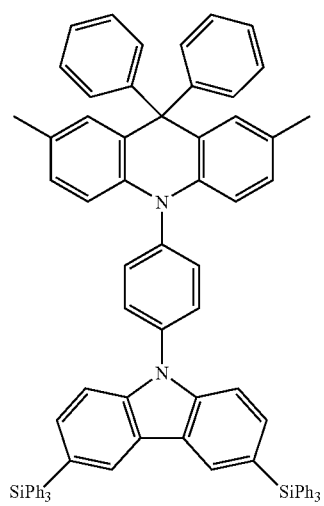
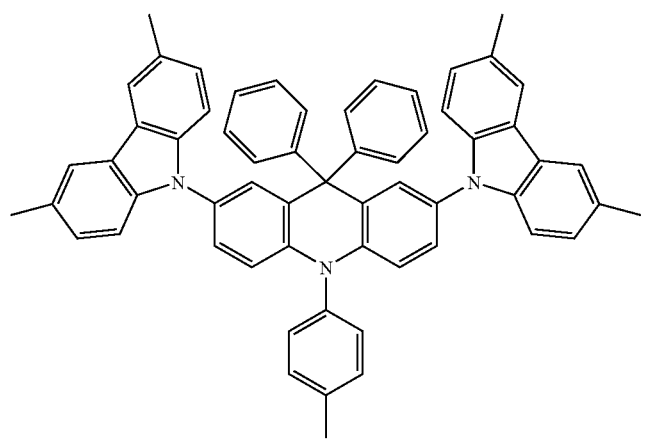
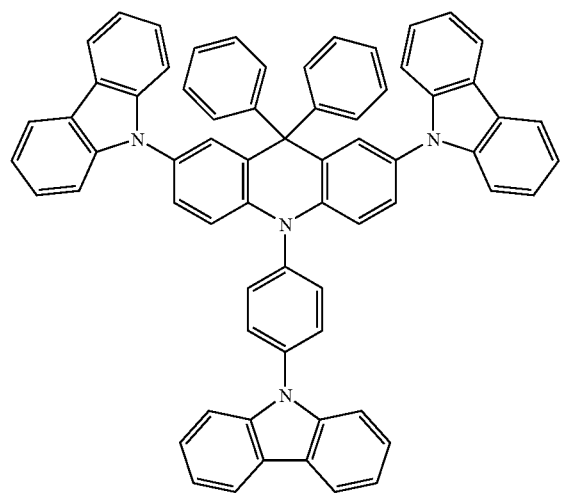

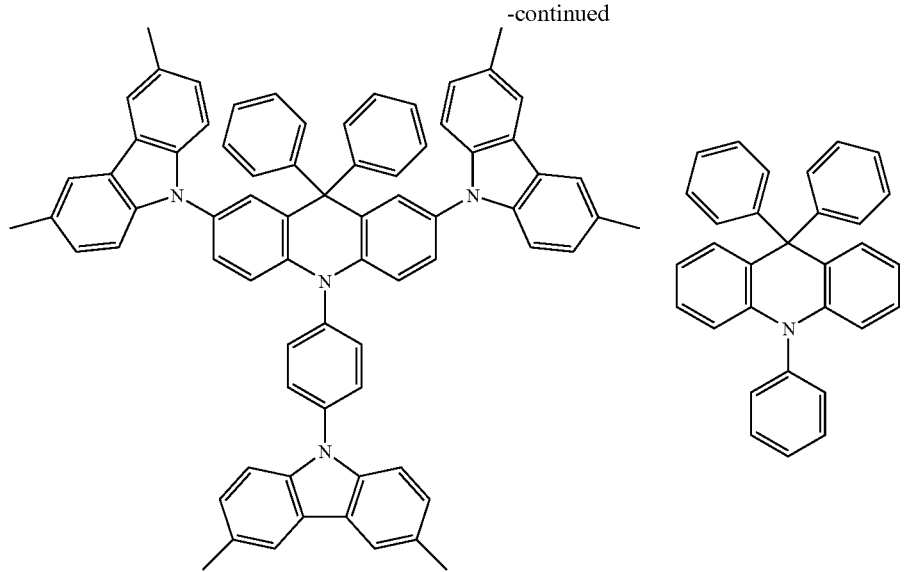
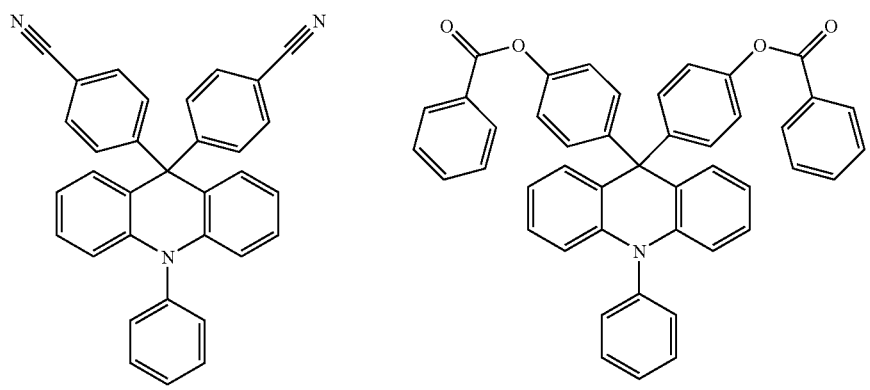
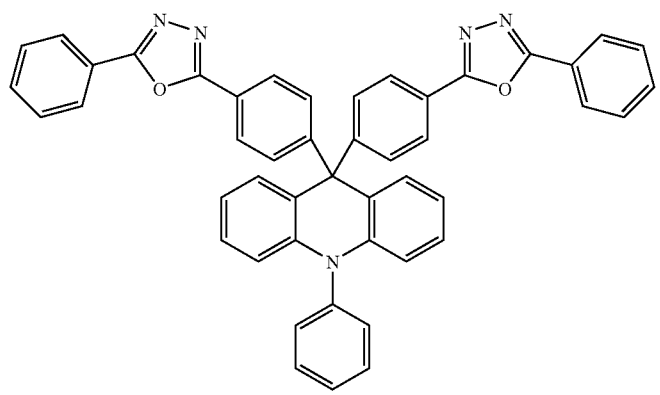

25
-continued
26
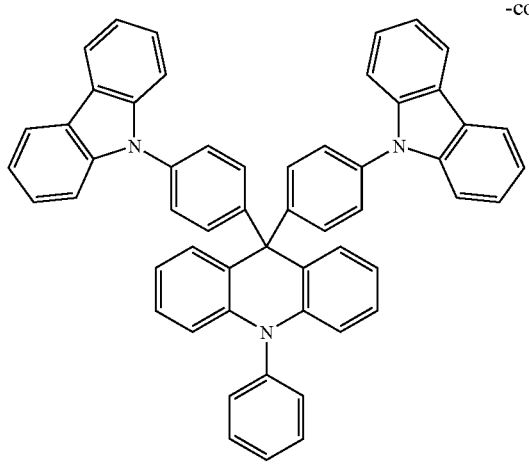
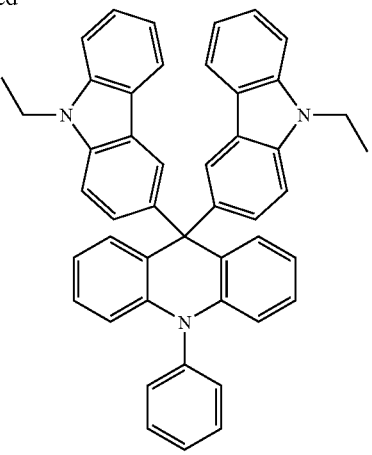
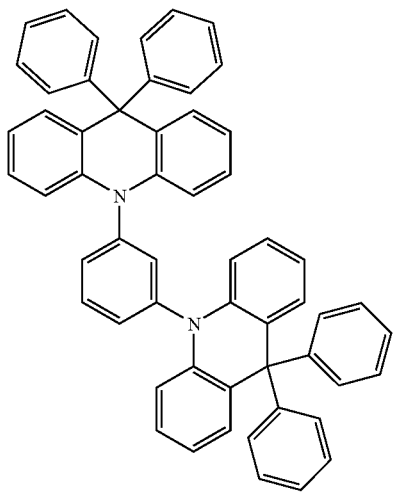
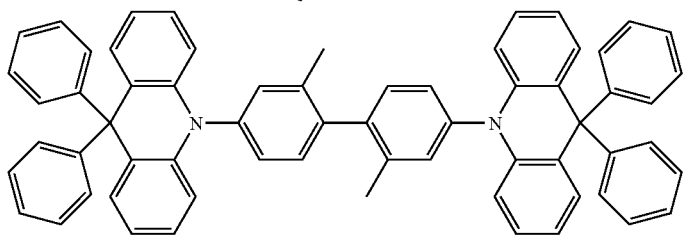
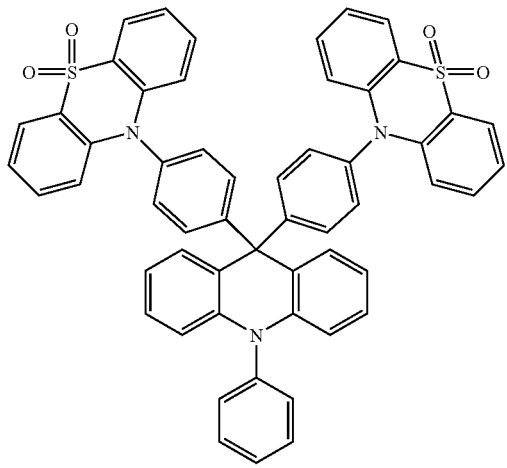
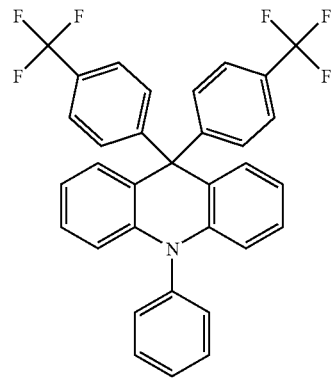

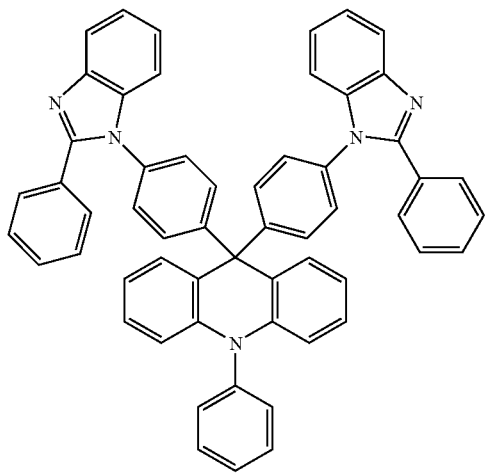
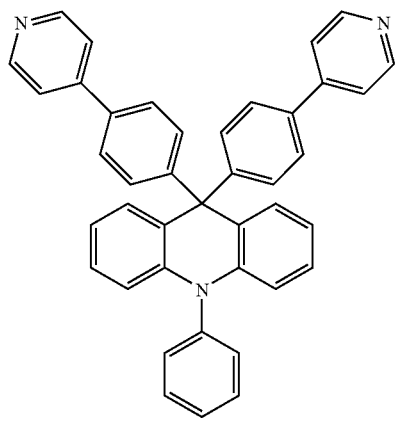
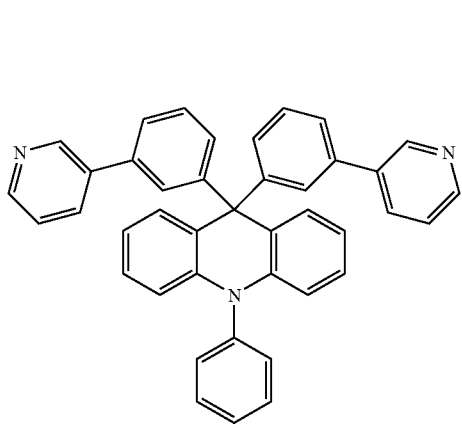
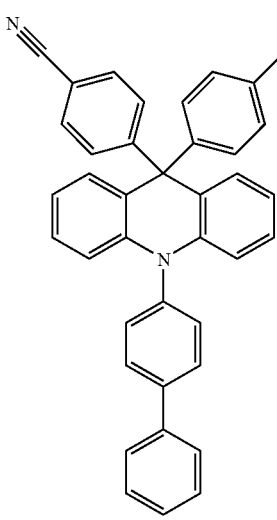
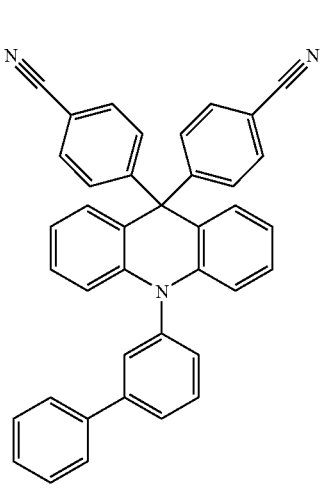
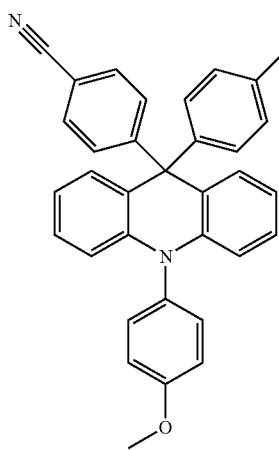
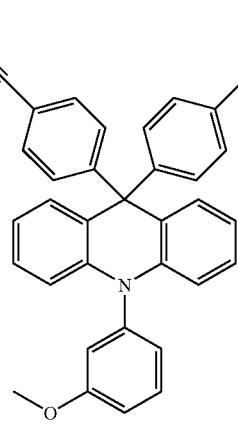
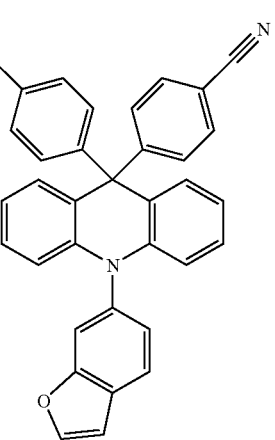

-continued
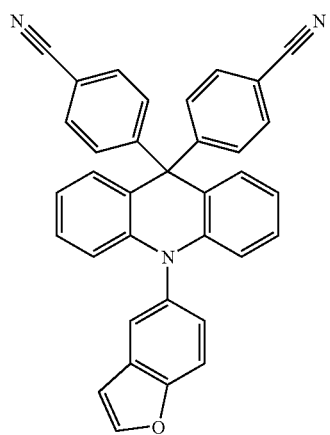
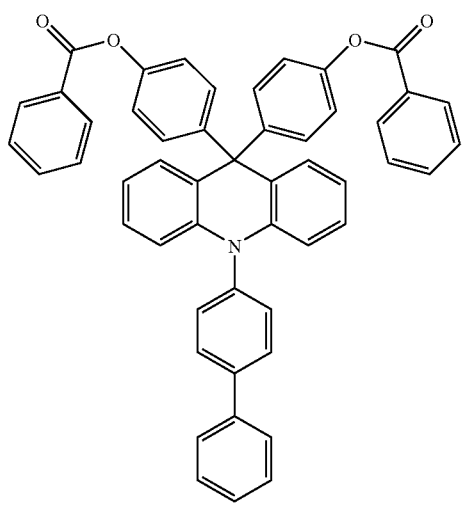
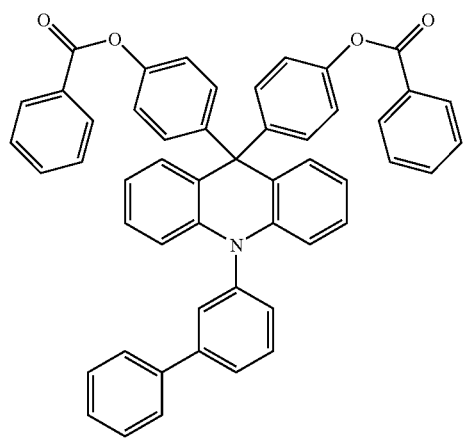
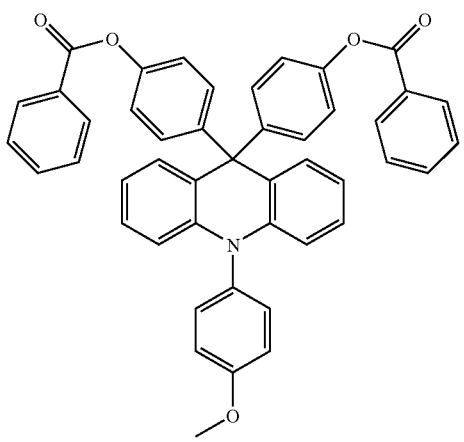
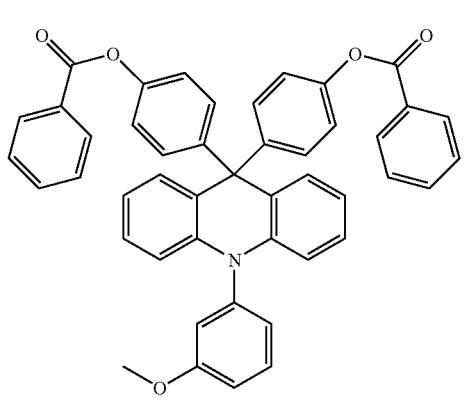
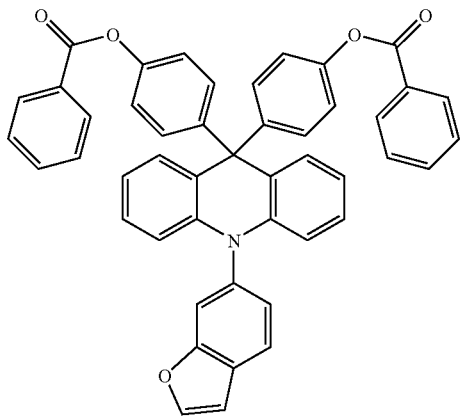

-continued
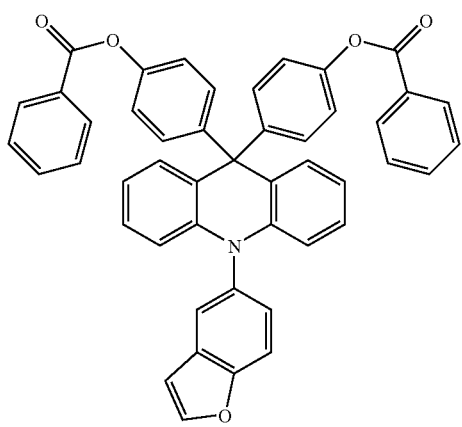
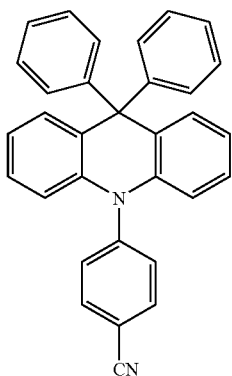
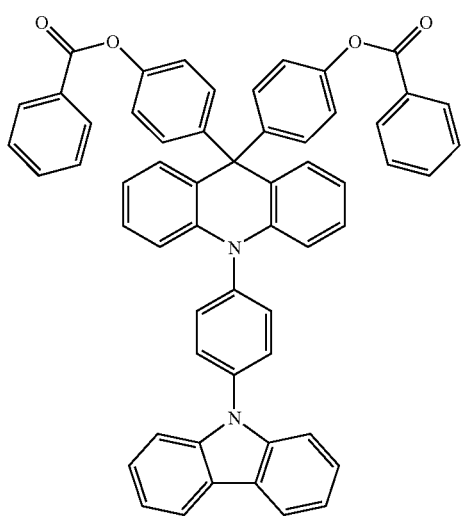
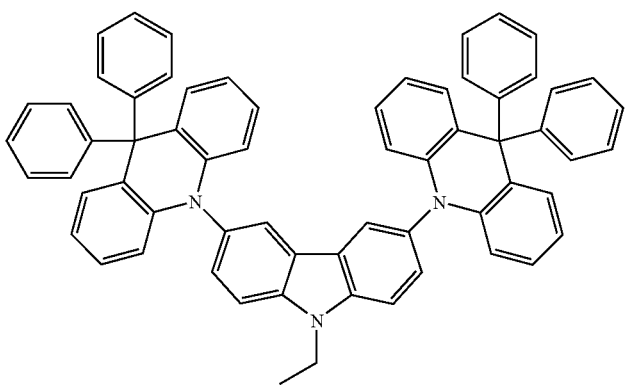
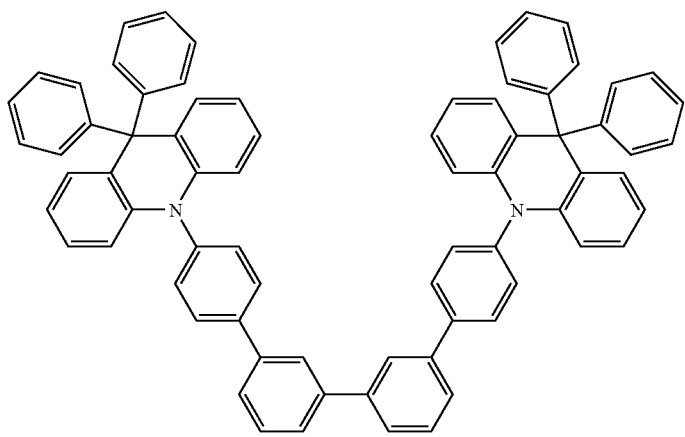

-continued
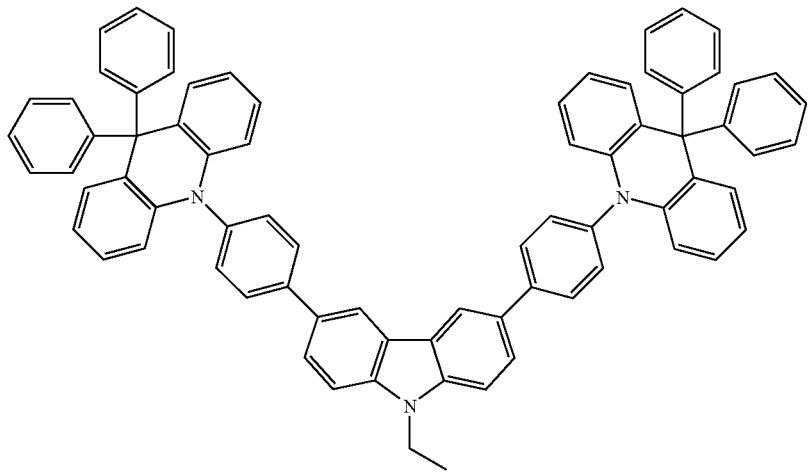
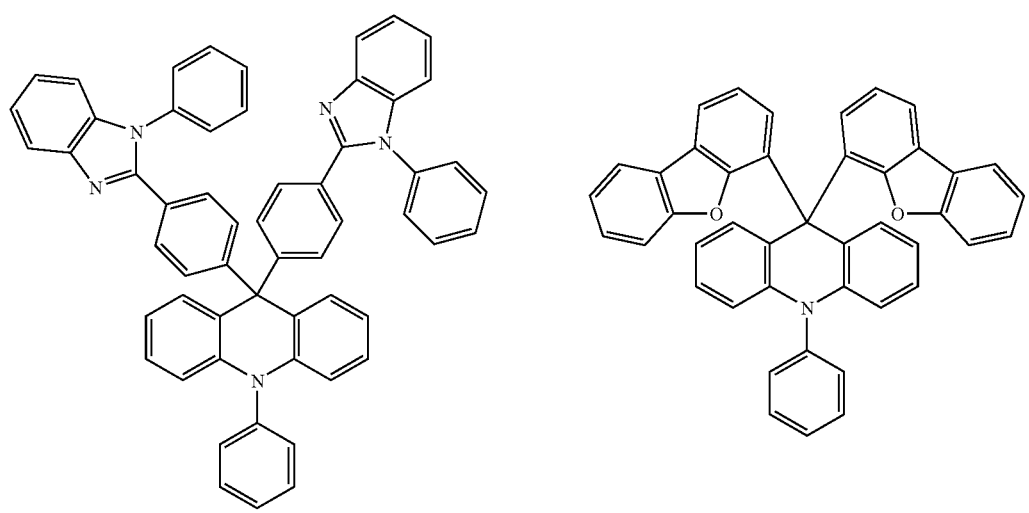
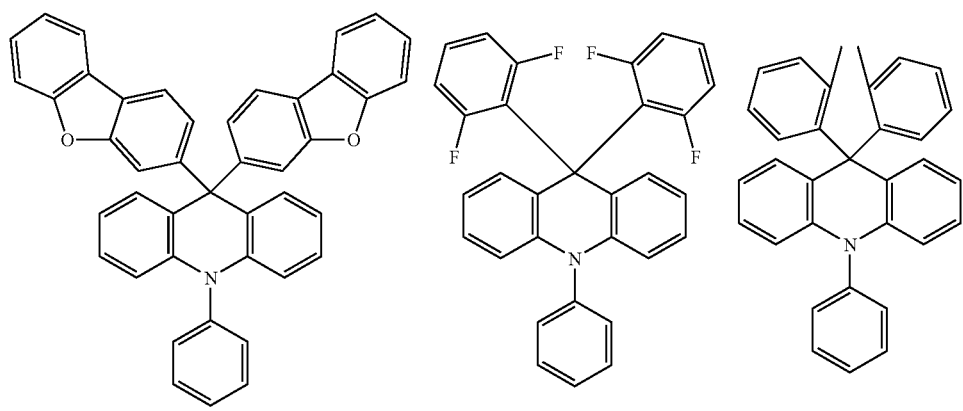

35
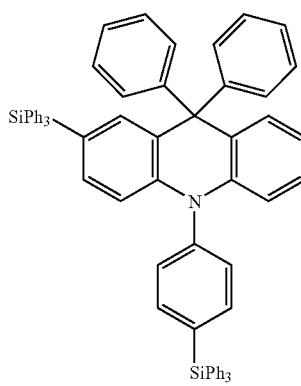 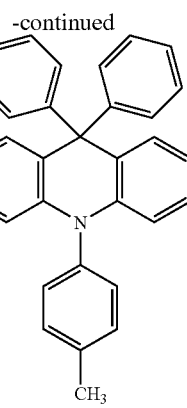 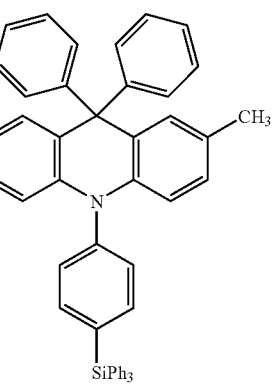
-continued
36
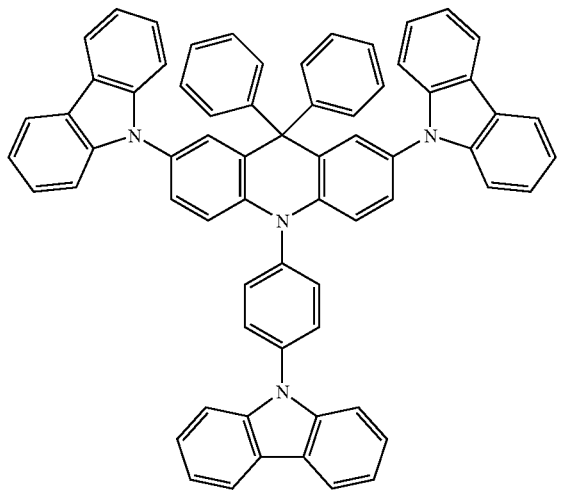 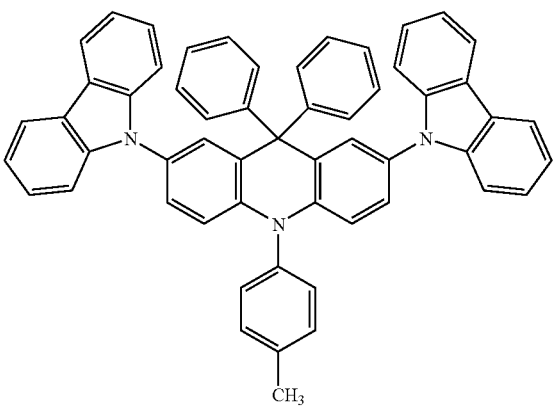
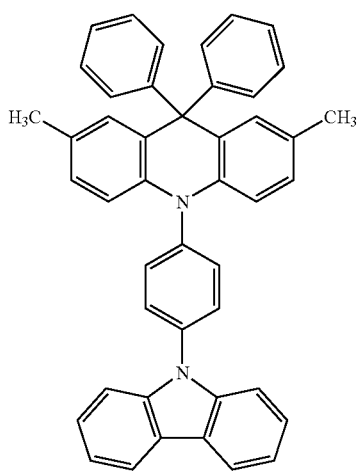 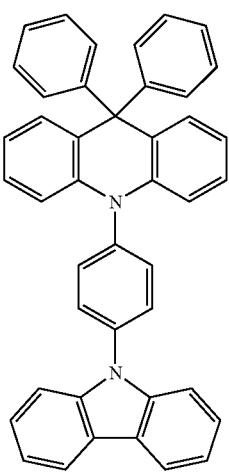
The acridine derivatives are prepared by processes known to those skilled in the art or processes which are derived from processes known to those skilled in the art. Suitable preparation processes are specified, for example, in the literature cited in the introductory part of the description.

For example, the acridine derivatives of the formula (I) can be prepared according to the following scheme 1:

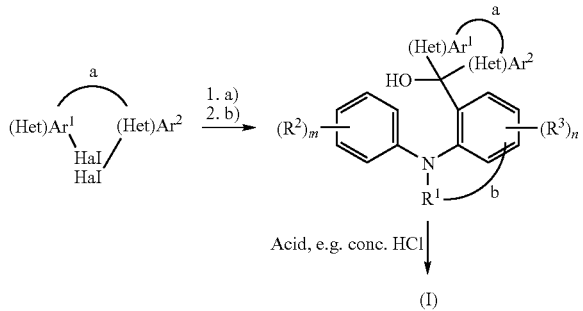

a) polar aprotic solvent, e.g. THF; metallating reagent, e.g. tert-BuLi; low temperature, e.g. -78° C.

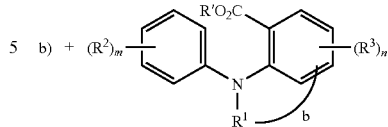

The radicals and symbols in scheme 1 are each as defined above for the compounds of the formula I, and Hal is halogen, e.g. fluorine, chlorine, bromine, iodine, preferably chlorine or bromine, more preferably bromine.

The process steps and reaction conditions, and also suitable polar aprotic solvents for performing the preparation process shown in scheme 1, are known to those skilled in the art.

Scheme 2 below shows, by way of example, a process for preparing 9,9-di(4-(N-carbazolyl)phenyl-N-phenyl-9,10-dihydroacridine:

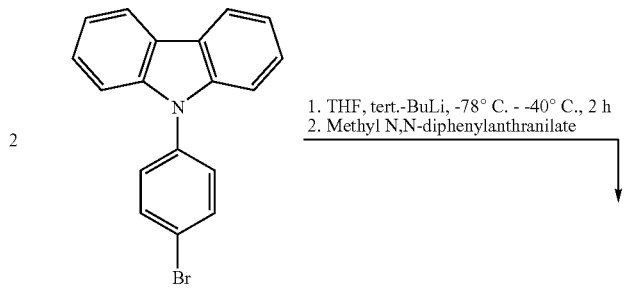

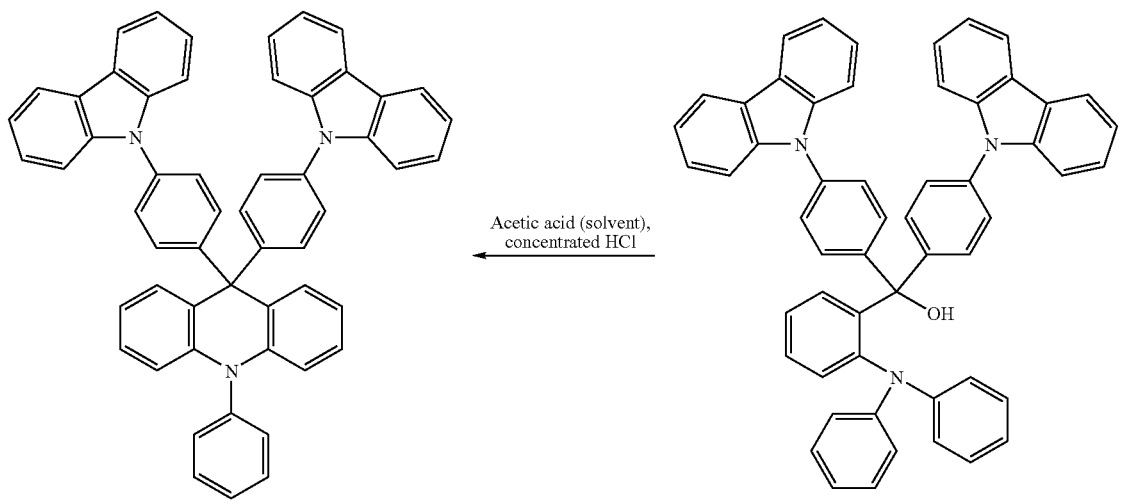

The acridine derivatives of the formula (I) are outstandingly suitable for use as matrix materials in the light-emitting layer in organic light-emitting diodes, and as electron blockers in OLEDs. In particular, they are suitable as matrix materials in the light-emitting layer, in which the emitter compounds used are one or more triplet emitters, and as electron blockers in a blocking layer for electrons directly adjacent to the light-emitting layer of an OLED, in which case the light-emitting layer comprises one or more triplet emitters.

The present invention therefore further provides an OLED comprising at least one acridine derivative of the formula (I) in the light-emitting layer in addition to at least one emitter compound, which is preferably at least one triplet emitter.

The present invention further additionally provides an OLED comprising at least one acridine derivative of the formula (I) in a blocking layer for electrons, in which case the blocking layer for electrons is preferably in direct contact with the light-emitting layer of the OLED and the light-emitting layer of the OLED preferably comprises at least one triplet emitter.

It is additionally possible that the acridine derivatives of the formula (I) are used both as a matrix material and as an electron blocker in an OLED. In this case, the acridine derivatives of the formula (I) used as a matrix material and as an electron blocker in an OLED are preferably different acridine derivatives of the formula (I).

The present invention further provides a light-emitting layer comprising at least one emitter compound and at least one matrix material, the matrix material used being at least one acridine derivative of the formula (I). Preferred acridine derivatives of the formula (I) have already been specified above. The at least one emitter compound is preferably a triplet emitter. Suitable triplet emitters are known to those skilled in the art. Preferred triplet emitters are specified below.

The present application further provides a blocking layer for electrons comprising at least one acridine derivative of the formula (I), preferred acridine derivatives of the formula (I) already having been specified above.

The suitability of the acridine derivatives of the formula (I) as an electron blocker or matrix material depends upon factors including the electronic conditions in the OLED and the substitution pattern of the acridine derivatives of the formula (I). In general, the matrix material has a stronger electron affinity than the electron blocker material. The electron affinity can be determined via the reduction potential, for example, in a cyclic voltammetry measurement, suitable measurement arrangements being known to those skilled in the art.

The present invention further provides an OLED comprising at least one inventive light-emitting layer.

The use of the acridine derivatives of the formula (I) as matrix materials and/or electron blockers is not intended to rule out the possibility that these compounds themselves also emit light. However, the matrix materials or electron blockers used in accordance with the invention have the effect that, in the normal case, for compounds which are used as emitters in OLEDs, an increase in the luminance and quantum yield compared to otherwise customary matrix materials and/or electron blockers is achieved.

Many of the emitter compounds used with preference are based on metal complexes, and, for example, the complexes of the metals Ru, Rh, Ir, Pd, Pt Re, Os, Cu and Au, especially the complexes of the metals Ru, Rh, Ir, Pd and Pt, in particular the complexes of Ir, have gained significance. The acridine derivatives of the formula I used in accordance with the invention are particularly suitable as matrix materials and/or electron blocker materials for emitters based on such metal complexes. In particular, they are suitable for use as matrix materials and/or electron blocker materials together with complexes of Ru, Rh, Ir, Pd and Pt, more preferably for use together with complexes of Ir.

Suitable metal complexes for use together with the acridine derivatives of the formula I as matrix materials and/or electron blocker materials in OLEDs are described, for example, in the documents WO 02/60910 A1, US 2001/0015432 A1, US 2001/0019782 A1, US 2002/0055014 A1, US 2002/0024293 A1, US 2002/0048689 A1, EP 1 191 612 A2, EP 1 191 613 A2, EP 1 211 257 A2, US 2002/0094453 A1, WO 02/02714 A2, WO 00/70655 A2, WO 01/41512 A1, WO 02/15645 A1, WO 2005/019373 A2, WO 2005/113704 A2, WO 2006/115301 A1, WO 2006/067074 A1, WO 2006/056418, WO 2006/103874 A1, WO 2005/123873 A1 and WO 2006/121811 A1.

Additionally suitable are the blue light-emitting iridium complexes iridium(III) bis[(4,6-di-fluorophenyl)pyridinato-N,C$^{2'}$]picolinate (FIrpic), which is disclosed, for example, in S. Lamansky et al., J. Am. Soc. 2001, 123, 4304 and C. Adachi et al., Appl. Phys. Lett. 2001, 79, 2082, and iridium(III) bis(4',6'-difluorophenylpyridinato)tetrakis(1-pyrazolyl)borate (FIr6), which is disclosed, for example, in R. J. Holmes et al., Appl. Phys. Lett. 2003, 83, 3818.

Further suitable metal complexes are the commercially available metal complexes tris(2-phenylpyridine)iridium (III), iridium(III) tris(2-(4-tolyl)pyridinato-N,C$^{2'}$), iridium (III) tris(1-phenylisoquinoline), iridium(III) bis(2-(2'-benzothienyl)pyridinato-N,C$^{3'}$)-(acetylacetonate), iridium(III) bis(2-(4,6-difluorophenyl)pyridinato-N,C$^{2}$)picolinate, iridium(III) bis(1-phenylisoquinoline)(acetylacetonate), iridium(III) bis(dibenzo[f,h]quin-oxaline)(acetylacetonate), and iridium(III) bis(2-methyldibenzo[f,h]quinoxaline) (acetyl-acetonate).

In addition, the following commercially available materials are suitable: tris(dibenzoylacetonato)mono(phenanthroline)europium(III), tris(dibenzoylmethane)-mono(phenanthroline)europium(III), tris(dibenzoylmethane)mono(5-aminophenan-throline)europium(III), tris(di-2-naphthoylmethane)mono(phenanthroline)europium(III), tris (4-bromobenzoylmethane)mono(phenanthroline)europium (III), tris(di(biphenyl-methane))mono(phenanthroline) europium(III), tris(dibenzoylmethane)-mono(4,7-diphenylphenanthroline)europium(III), tris (dibenzoylmethane)mono(4,7-dimethyl-phenanthroline) europium(III), tris(dibenzoylmethane)mono(4,7-dimethylphenanthroline-disulfonic acid)europium(III) disodium salt, tris[di(4-(2-(2-ethoxyethoxy)ethoxy)benzoylmethane)]mono(phenanthroline)europium(III) and tris[di(4-(2-(2-ethoxyethoxy)-ethoxy)benzoylmethane)]mono(5-aminophenanthroline)europium(III).

In addition, the following complexes are suitable as emitter materials for use together with the acridine derivatives of the formula (I) in OLEDs:

Homoleptic complexes of the general formula (II):

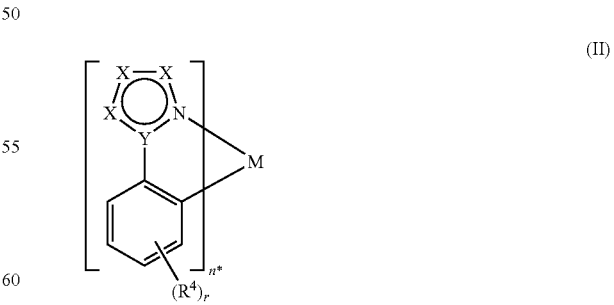

in which:
X is N, NH, NR$^4$, CH, CR$^4$, O or S;
Y is C or N;
R$^4$ is in each case independently a substituent selected from the group consisting of alkyl, aryl, heteroaryl, alkoxy, aryloxy, arylcarbonyloxy, silyl and halogen, preferred alkyl, aryl, heteroaryl, alkoxy, aryloxy, aryloxycarbonyloxy, silyl and halogen groups having been specified above. Very particularly preferred $R^4$ radicals are substituted or unsubstituted phenyl, where substituted phenyl is preferably phenyl substituted by alkyl substituents such as $C_1$-$C_8$-alkyl radicals, preferably $C_1$- to $C_4$-alkyl radicals, which may be linear or branched, more preferably methyl, ethyl, n-propyl, isopropyl, n-butyl, isobutyl, sec-butyl or tert-butyl; methyl; methoxy; $CF_3$; CN; silyl (preferably triphenylsilyl, diphenylmethylsilyl, phenyldimethylsilyl);

M is Ir, Rh, Pt, Pd or Ru, preferably Ir;

n*, depending of the valency of M, is 2, 3 or 4, preferably—when M is Ir—3;

r is 0, 1, 2, 3 or 4, preferably 0, 1 or 2, more preferably 0 or 1, where, in the cases that r is 0, all substitutable positions of the aryl radical bear hydrogen atoms.

Preferred homoleptic complexes of the formula (II) have the following structures:

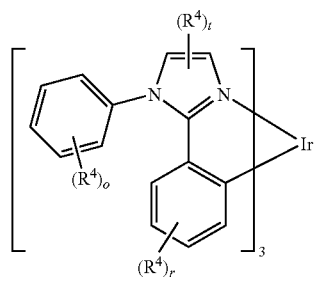

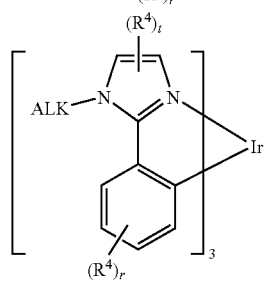

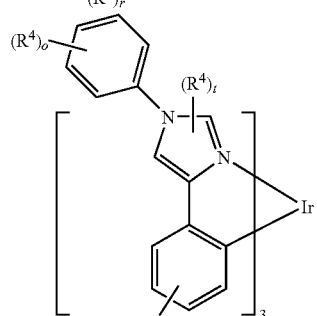

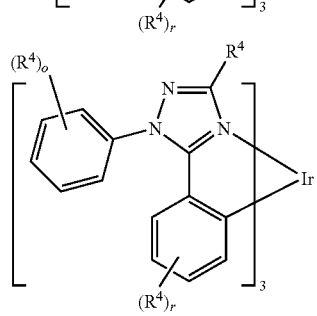

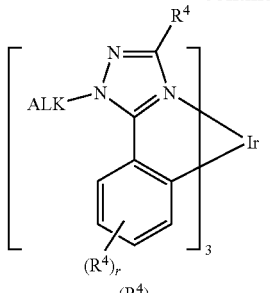

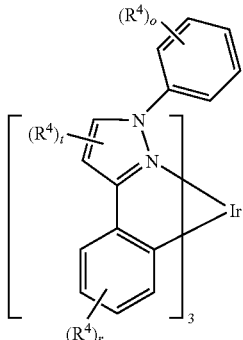

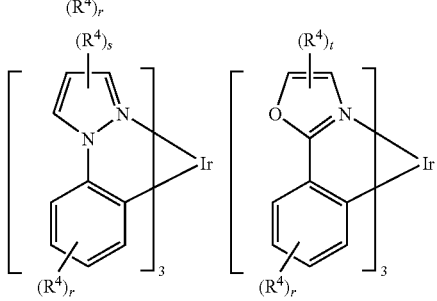

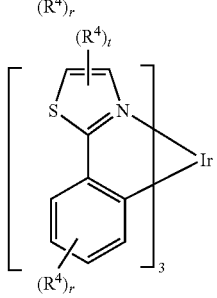

in which:

$R^4$ is in each case independently a substituent selected from the group consisting of alkyl, aryl, heteroaryl, alkoxy, aryloxy, arylcarbonyloxy, silyl and halogen, preferred alkyl, aryl, heteroaryl, alkoxy, aryloxy, aryloxycarbonyloxy, silyl and halogen groups having been specified above. Very particularly preferred $R^4$ radicals are substituted or unsubstituted phenyl, where substituted phenyl is preferably phenyl substituted by alkyl substituents such as $C_1$-$C_8$-alkyl radicals, preferably $C_1$- to $C_4$-alkyl radicals, which may be linear or branched, more preferably methyl, ethyl, n-propyl, isopropyl, n-butyl, isobutyl, sec-butyl or tert-butyl; methyl; methoxy; $CF_3$; CN; silyl (preferably triphenylsilyl, diphenylmethylsilyl, phenyldimethylsilyl);

ALK is an alkyl radical, preferably a $C_1$- to $C_4$-alkyl radical, which may be linear or branched, more preferably methyl, ethyl, n-propyl, isopropyl, n-butyl, isobutyl, sec-butyl or tert-butyl;

o is 0, 1, 2, 3, 4, 5, preferably 0, 1, 2, 3, more preferably 0 or 1;

r is 0, 1, 2, 3, 4, preferably 0, 1 or 2, more preferably 0 or 1;
s is 0, 1, 2, 3, preferably 0 or 1;
t is 0, 1, 2, preferably 0 or 1;
where, in the cases in which o, p, r, s or t is 0, the aforementioned base skeletons bear hydrogen atoms at their substitutable positions.

Heteroleptic complexes of the general formula (III):

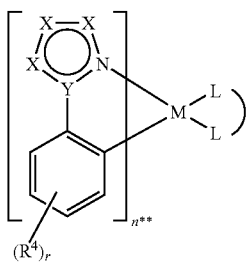
(III)

in which the symbols and radicals X, Y, M, R⁴ and r are each independently as defined for the general formula (II), and
n** depending on the valency of M, is 1, 2 or 3, preferably—when M is Ir—2;

is a monoanionic bidentate ligand, for example acetylacetonate and derivatives thereof, picolinate and derivatives thereof, Schiff bases, amino acids and ligands of the following general formulae:

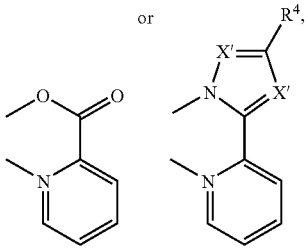

in which X' is independently N or CH and $R^4$ is as defined above.

Preferred heteroleptic complexes of the formula (III) have the following structures:

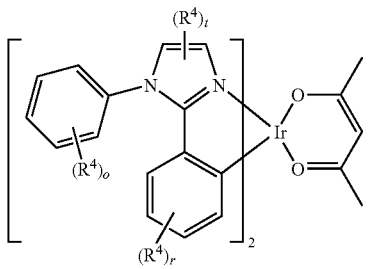

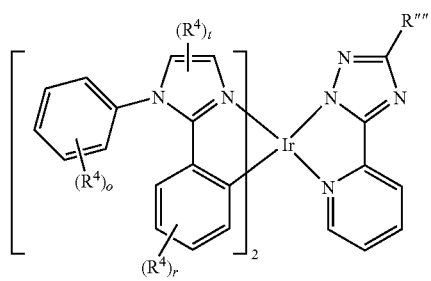

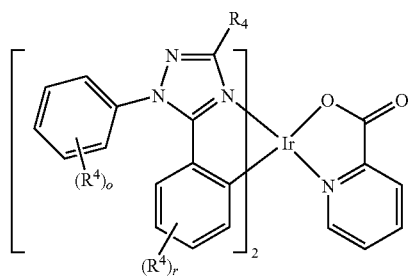

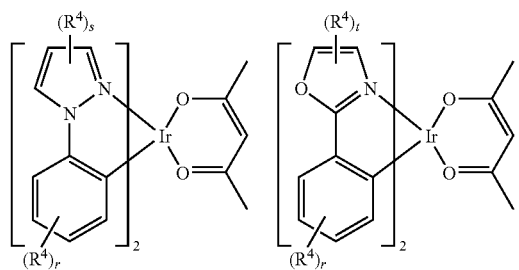

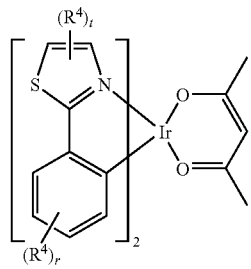

in which the radicals and indices $R^4$, o, r, s and t are each as defined above for the preferred compounds of the formula (II).

Homoleptic complexes of the general formula (IV):

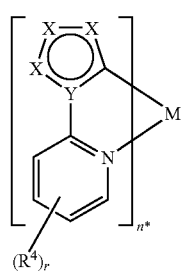
(IV)

in which the symbols and radicals X, Y, M, $R^4$, n* and r are each independently as defined for the general formula (II).

Preferred homoleptic complexes of the formula (IV) have the following structures:

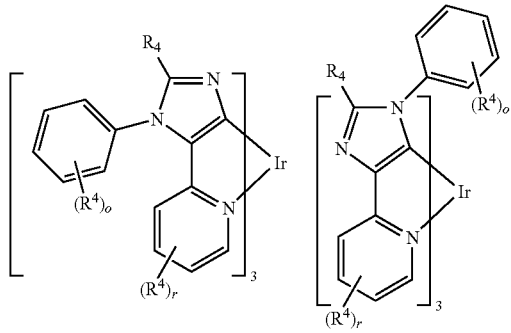
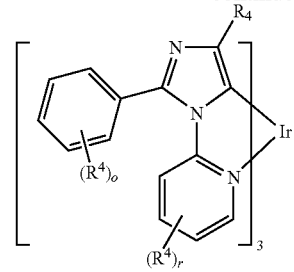
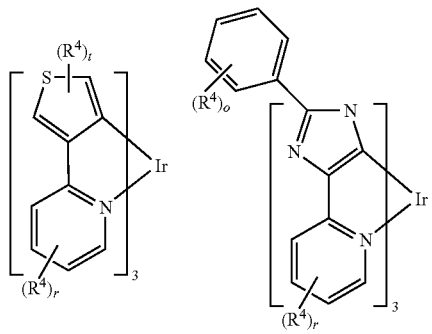
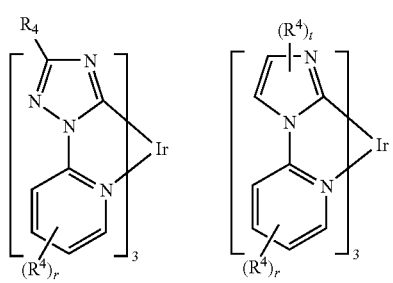
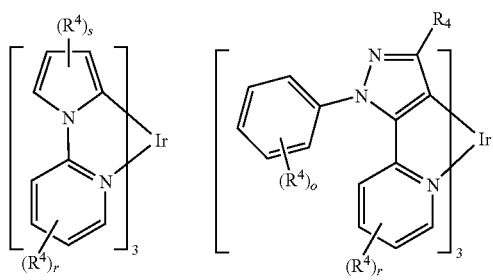
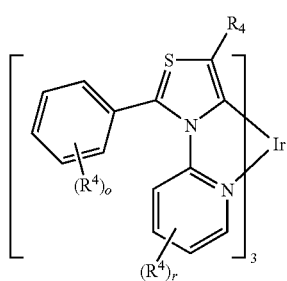

in which the radicals and indices $R^4$, o, r, s and t are each as defined above for the preferred compounds of the formula (II).

Heteroleptic complexes of the general formula (V):

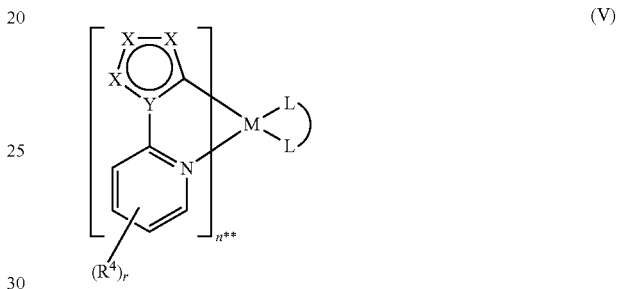

(V)

in which the symbols and radicals X, Y, M, $R^4$, $n^{**}$, r and

are each independently as defined for the general formula (III).

Preferred heteroleptic complexes of the formula (V) have the following structures:

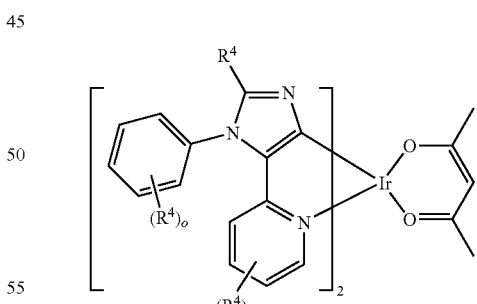
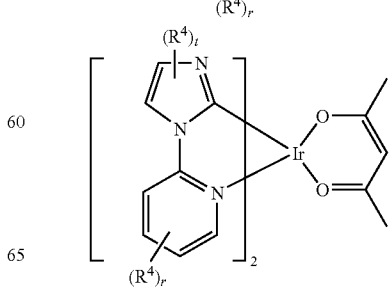

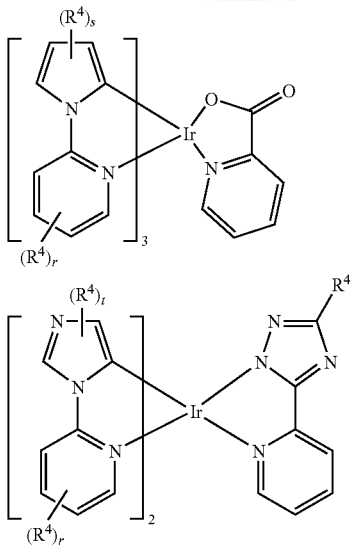

in which the radicals and indices $R^4$, o, r, s and t are each as defined above for the preferred compounds of the formula (III).

The aforementioned metal complexes are prepared by processes known to those skilled in the art. The stoichiometries and reaction conditions can be determined without any problem by the person skilled in the art on the basis of the aforementioned patent applications.

In a preferred embodiment of the present invention, the acridine derivatives of the formula (I) are used in the light-emitting layer as a matrix material together with carbene complexes as a triplet emitter, i.e. particularly preferred triplet emitters are carbene complexes. Suitable carbene complexes are known to those skilled in the art and are specified in some of the applications mentioned above and below. In a further preferred embodiment, the acridine derivatives of the formula (I) are used as an electron blocker material together with carbene complexes as a triplet emitter. The acridine derivatives of the formula (I) may additionally be used both as matrix materials and as electron blocker materials together with carbene complexes as triplet emitters.

Suitable metal complexes for use together with the acridine derivatives of the formula I as matrix materials and/or electron blocker materials in OLEDs are thus, for example, also carbene complexes as described in WO 2005/019373 A2, WO 2006/056418 A2 and WO 2005/113704, and in the prior European applications EP 06 112 228.9 and EP 06 112 198.4, which have an earlier priority date but have not been published at the priority date of the present application. The disclosure of the WO and EP applications cited is hereby incorporated explicitly, and these disclosures shall be considered to be incorporated into the content of the present application. In particular, suitable metal complexes for use together with the acridine derivatives of the formula I comprise, as matrix materials and/or electron blocker materials in OLEDs, carbene ligands of the following structures disclosed, inter alia, in WO 2005/019373 A2 (the designation of the variables used hereinafter was adopted from the application WO 2005/019373 A2; with regard to the more exact definition of the variables, reference is made explicitly to this application):

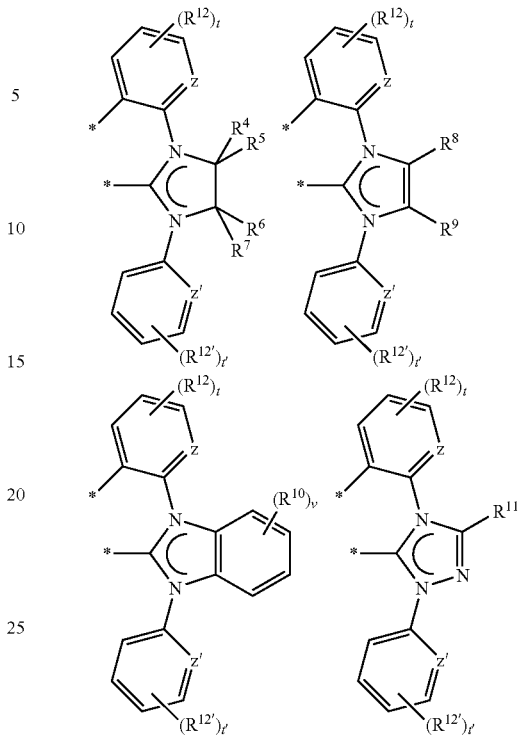

in which:
* denotes the attachment sites of the ligand to the metal center;
z, z' are the same or different and are each CH or N;
$R^{12}$, $R^{12'}$ are the same or different and are each an alkyl, aryl, heteroaryl or alkenyl radical, preferably an alkyl or aryl radical, or in each case 2 $R^{12}$ or $R^{12'}$ radicals together form a fused ring which may optionally comprise at least one heteroatom, preferably N; preferably in each case 2 $R^{12}$ or $R^{12'}$ radicals together form a fused aromatic $C_6$ ring, where one or more further aromatic rings may optionally be fused to this preferably six-membered aromatic ring, any conceivable fusion being possible, and the fused radicals may in turn be substituted; or $R^{12}$ or $R^{12'}$ is a radical with donor or acceptor action, preferably selected from the group consisting of halogen radicals, preferably F, Cl, Br, more preferably F; alkoxy, aryloxy, carbonyl, ester, amino groups, amide radicals, $CHF_2$, $CH_2F$, $CF_3$, CN, thio groups and SCN;
t and t' are the same or different, preferably the same, and are each from 0 to 3, where, when t or t' is >1, the $R^{12}$ or $R^{12'}$ radicals may be the same or different; t or t' is preferably 0 or 1; the $R^{12}$ or $R^{12'}$ radical is, when t or t' is 1, in the ortho-, meta- or para-position to the bonding site with the nitrogen atom adjacent to the carbene carbon atom;
$R^4$, $R^5$, $R^6$,
$R^7$, $R^8$, $R^9$
and $R^{11}$ are each hydrogen, alkyl, aryl, heteroaryl, alkenyl or a substituent with donor or acceptor action, preferably selected from halogen radicals, preferably F, Cl, Br, more preferably F, alkoxy radicals, aryloxy radicals, carbonyl radicals, ester radicals, amine radicals, amide radicals, $CH_2F$ groups, $CHF_2$ groups, $CF_3$ groups, CN groups, thio groups and SCN groups, preferably hydrogen, alkyl, heteroaryl or aryl, R¹⁰ is alkyl, aryl, heteroaryl or alkenyl, preferably alkyl, heteroaryl or aryl, or in each case 2 R¹⁰ radicals together form a fused ring which may optionally comprise at least one heteroatom, preferably nitrogen; preferably in each case 2 R¹⁰ radicals together form a fused aromatic $C_6$ ring, where one or more further aromatic rings may optionally be fused to this preferably six-membered aromatic ring, any conceivable fusion being possible, and the fused radicals may in turn be substituted; or R¹⁰ is a radical with donor or acceptor action, preferably selected from the group consisting of halogen radicals, preferably F, Cl, Br, more preferably F; alkoxy, aryloxy, carbonyl, ester, amino groups, amide radicals, $CHF_2$, $CH_2F$, $CF_3$, CN, thio groups and SCN v is from 0 to 4, preferably 0, 1 or 2, most preferably 0, where, when v is 0, the four carbon atoms of the aryl radical in formula c, which are optionally substituted by $R^{10}$, bear hydrogen atoms.

In particular, suitable metal complexes for use together with the acridine derivatives of the formula I as matrix materials and/or electron blocker materials in OLEDs comprise Ir-carbene complexes of the following structures disclosed in WO 2005/019373 A2:

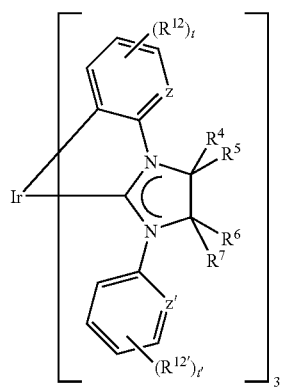

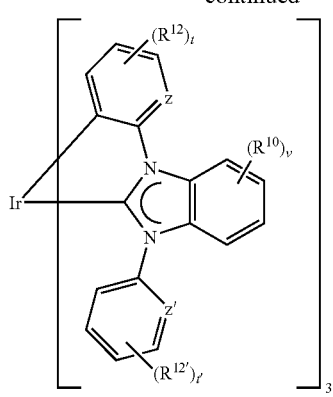

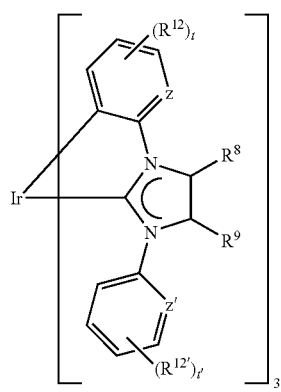

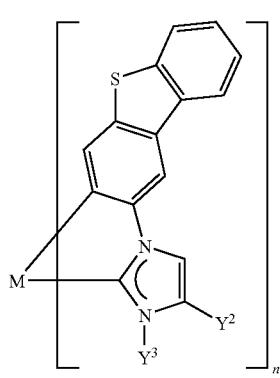

where the variables are each as already defined above.

Further suitable metal complexes for use together with the acridine derivatives of the formula I as matrix materials and/or electron blocker materials in OLEDs are especially also structures disclosed in WO 2006/056418 A2 (the designation of the variables used hereinafter was adopted from the application WO 2006/056418 A2; with regard to the more exact definition of the variables, reference is made explicitly to this application):

51
-continued
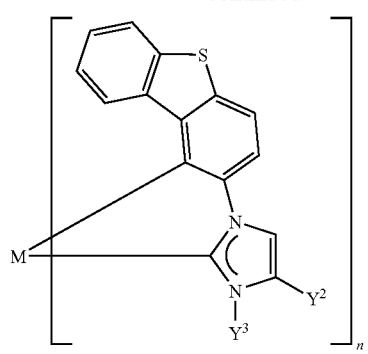
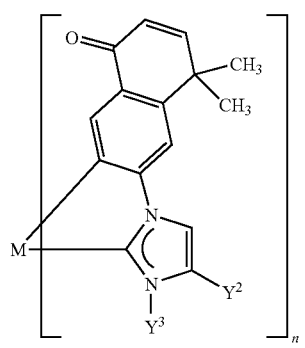
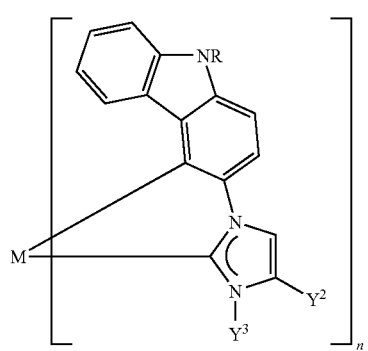
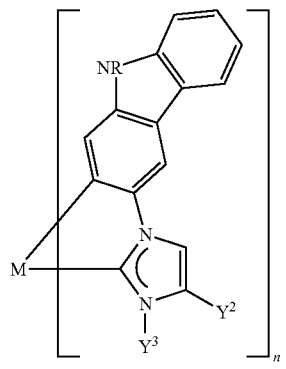
52
-continued
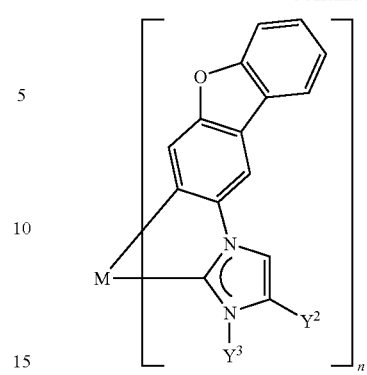
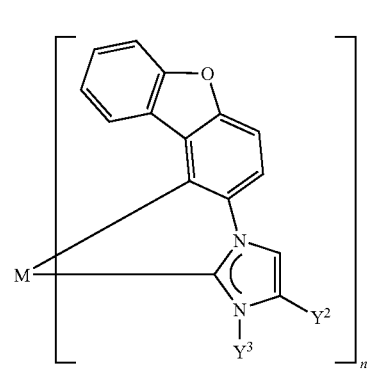
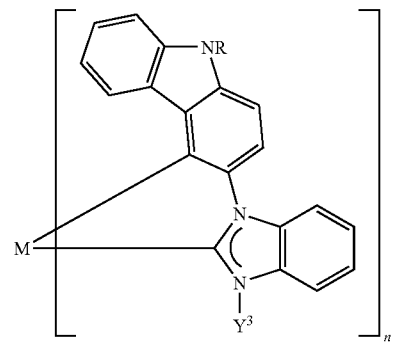
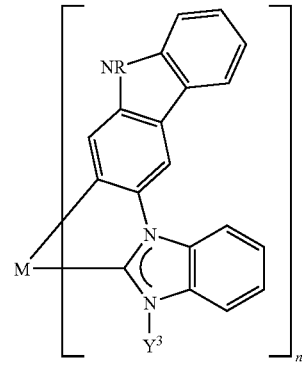

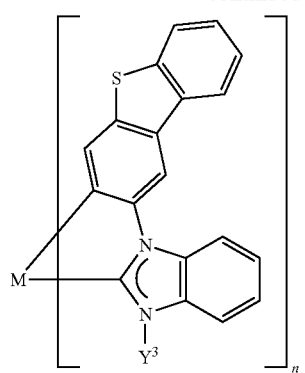
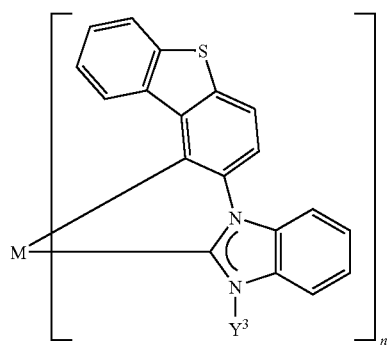
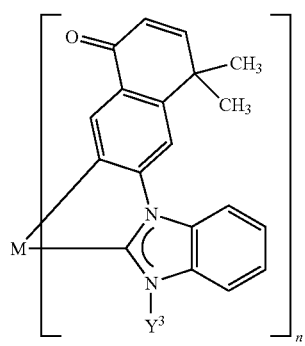
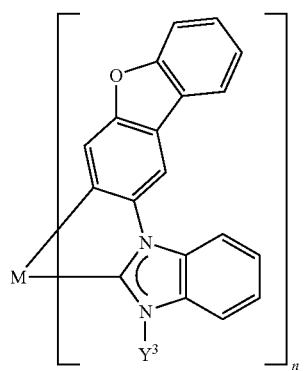
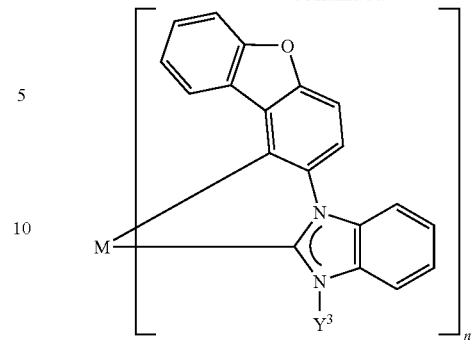
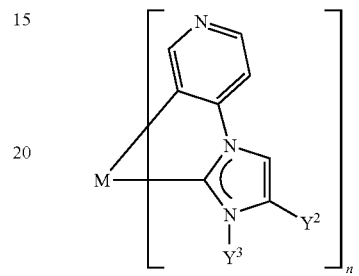
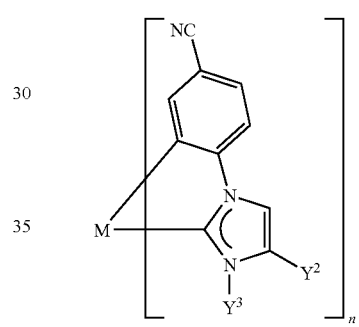
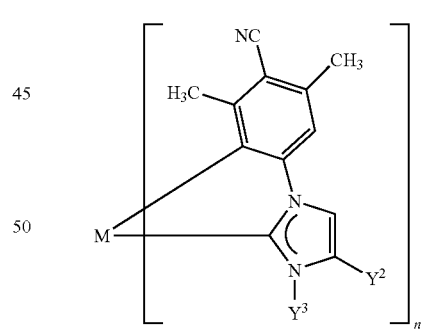
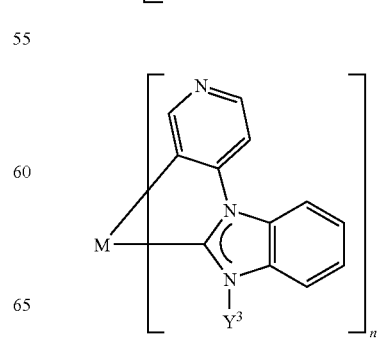

-continued
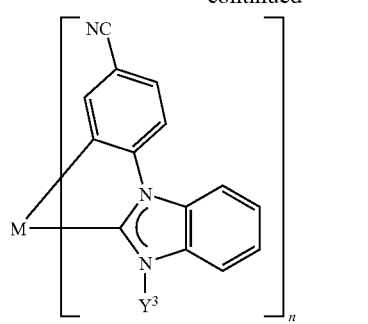
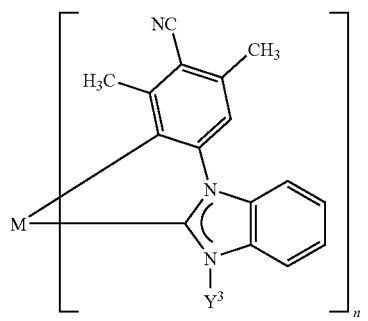
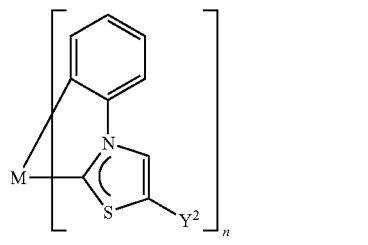
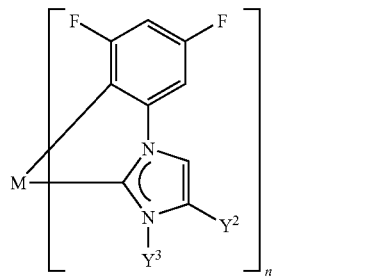
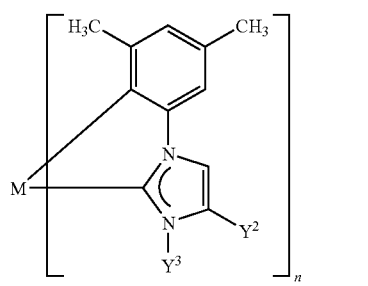
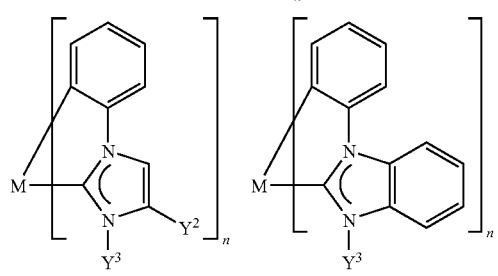
-continued
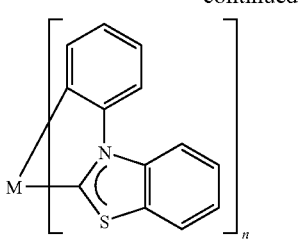
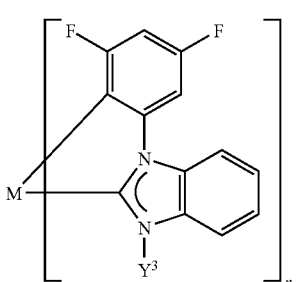
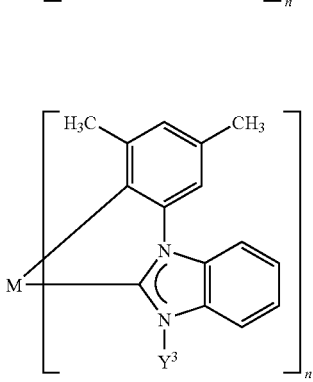
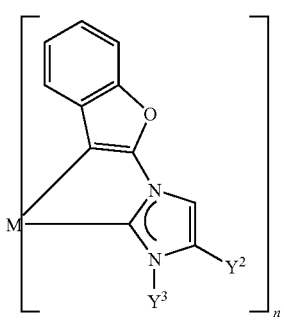
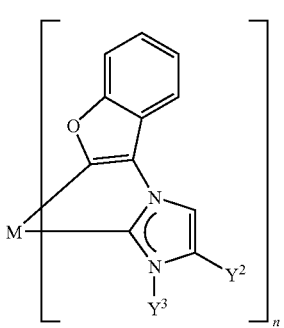

57
-continued
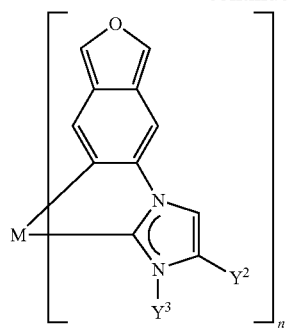
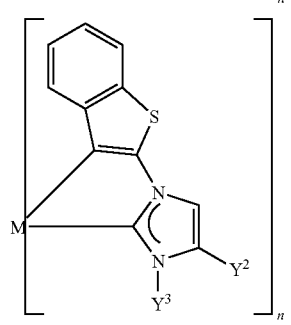
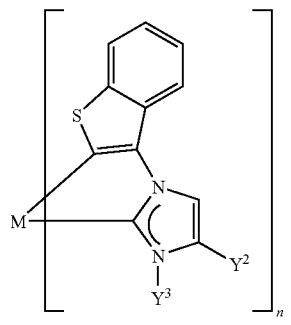
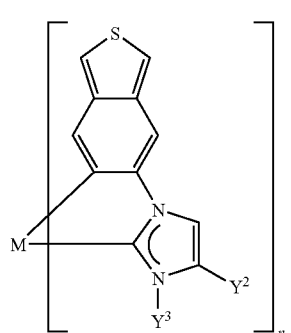
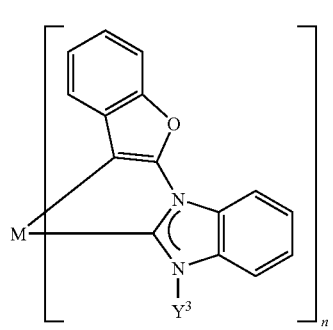
58
-continued
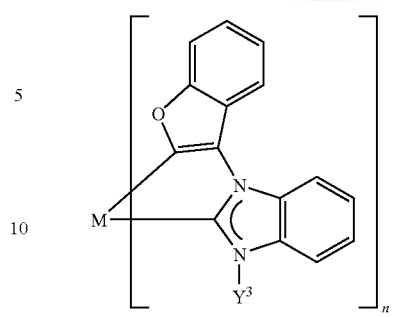
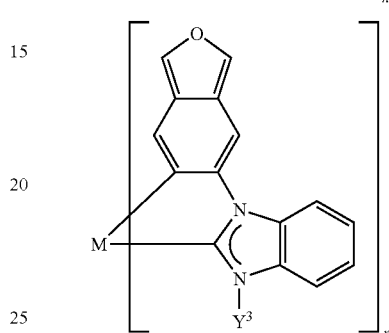
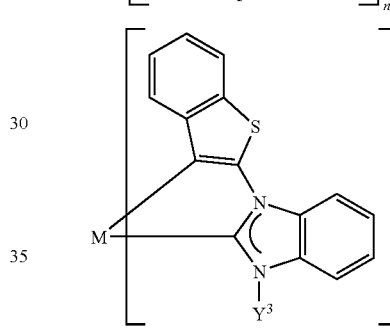
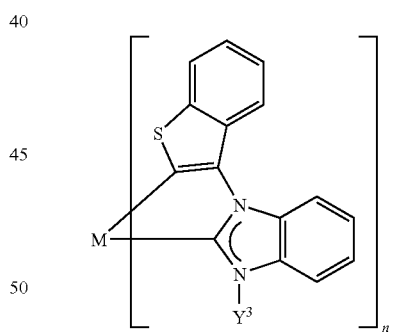
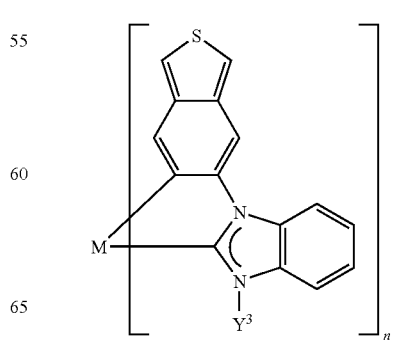

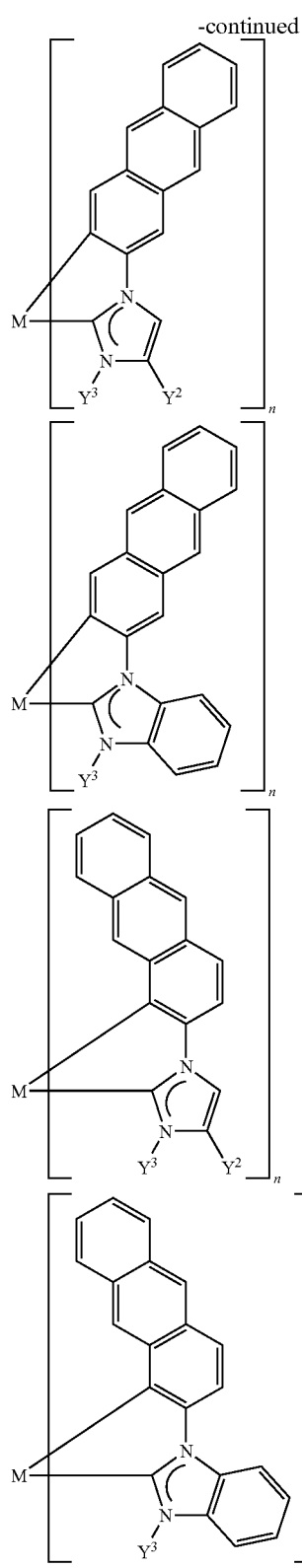

in which M is Ru(III), Rh(III), Ir(III), Pd(II) or Pt(II), n assumes the value of 3 for Ru(III), Rh(III) and Ir(III), and the value of 2 for Pd(II) and Pt(II), and $Y^2$ and $Y^3$ are each hydrogen, methyl, ethyl, n-propyl, isopropyl or tert-butyl. M is preferably Ir(III) with n equal to 3. $Y^3$ is preferably methyl, ethyl, n-propyl, isopropyl or tert-butyl.

Further suitable metal complexes for use together with the acridine derivatives of the formula I as matrix materials and/or electron blocker materials in OLEDs are especially also:

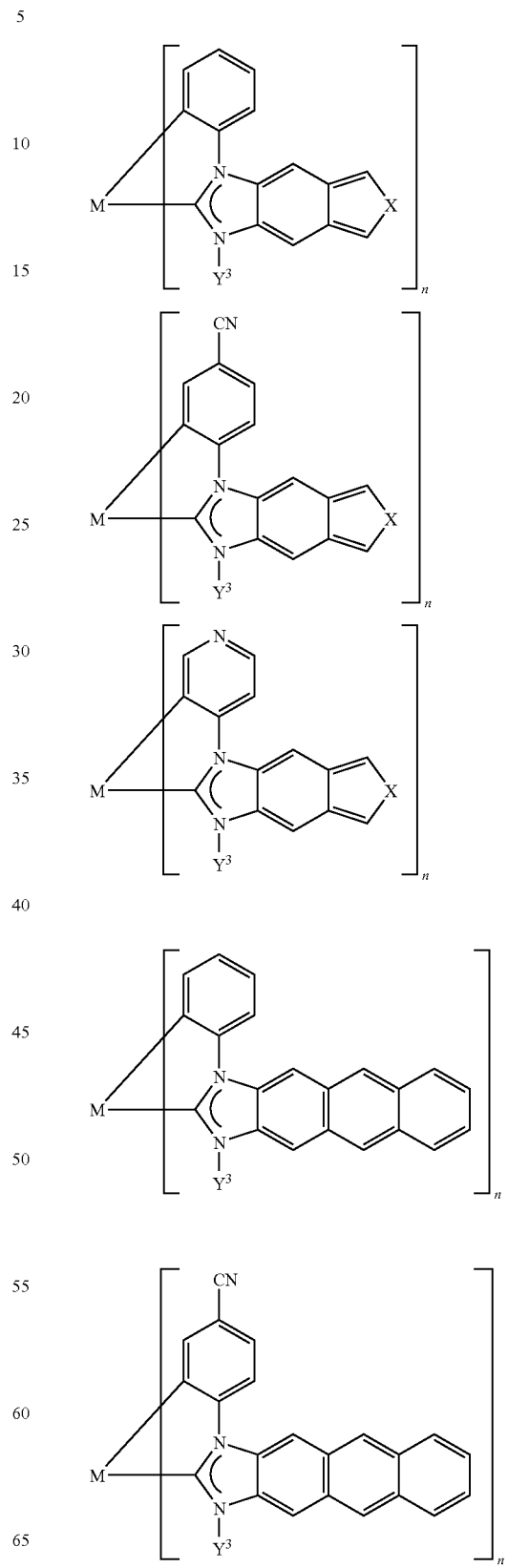

-continued

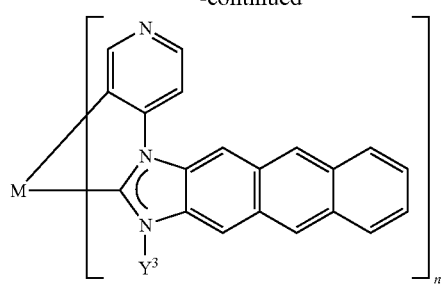

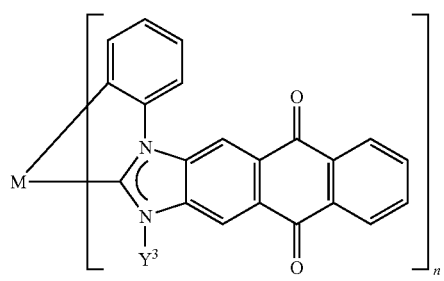

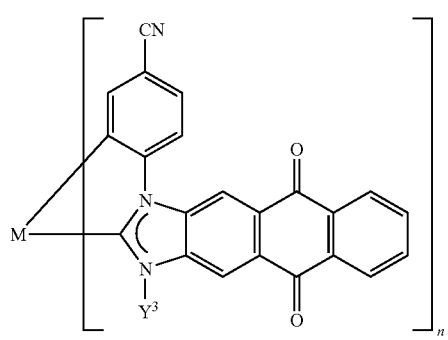

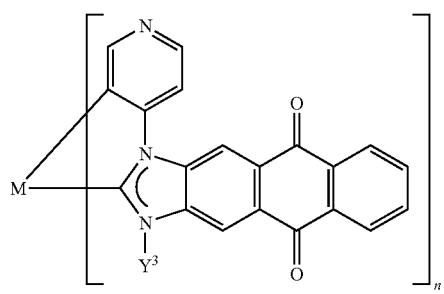

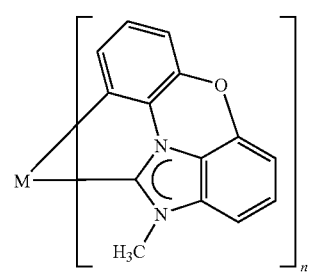

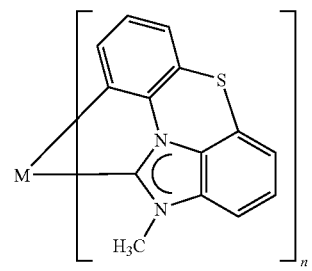

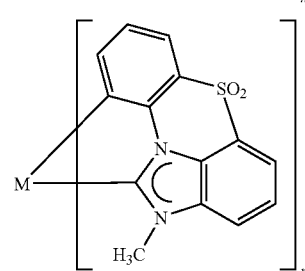

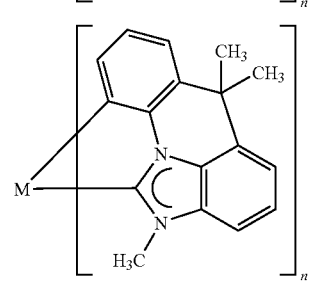

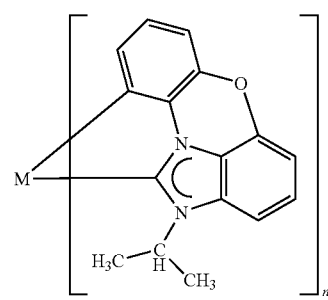

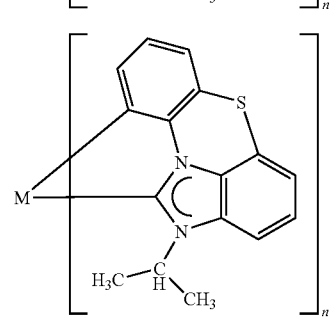

in which M is Ru(III), Rh(III), Ir(III), Pd(II) or Pt(II), n assumes the value of 3 for Ru(III), Rh(III) and Ir(III), and the value of 2 for Pd(II) and Pt(II), and $Y^3$ is hydrogen, methyl, ethyl, n-propyl, isopropyl or tert-butyl. M is preferably Ir(III) with n equal to 3. $Y^3$ is preferably methyl, ethyl, n-propyl, isopropyl or tert-butyl.

Further suitable metal complexes for use together with the acridine derivatives of the formula I as matrix materials and/or electron blocker materials in OLEDs are especially also:

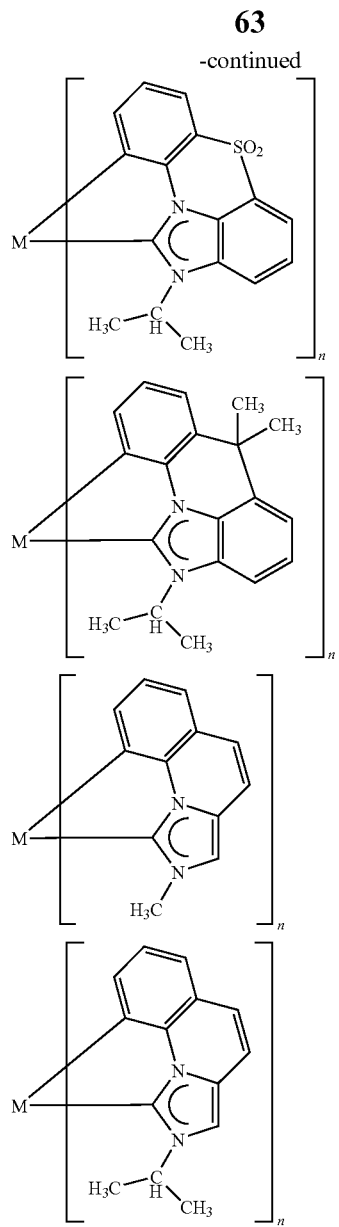
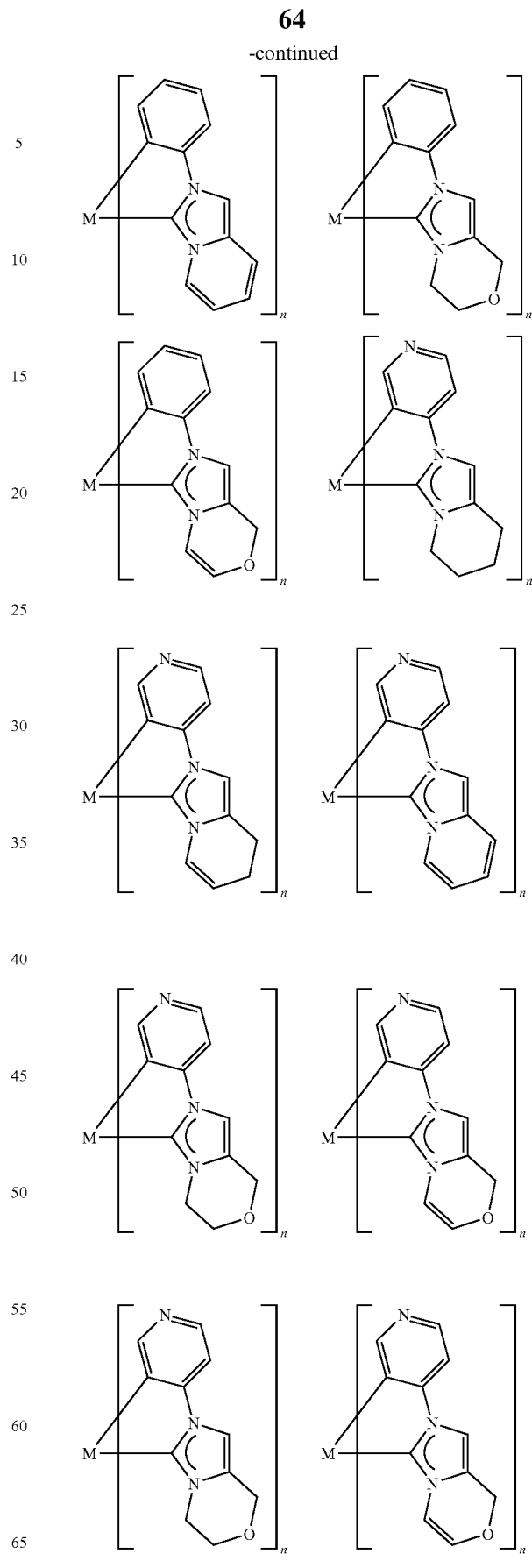
in which M is Ru(III), Rh(III) and especially Ir(III), Pd(II) or Pt(II), n assumes the value of 3 for Ru(III), Rh(III) and Ir(III), and the value of 2 for Pd(II) and Pt(II).
Further suitable metal complexes for use together with the acridine derivatives of the formula I as matrix materials and/or electron blocker materials in OLEDs are especially also:

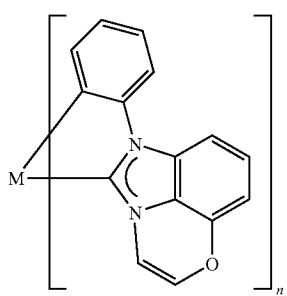
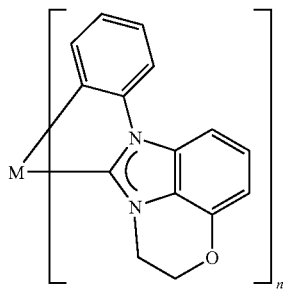
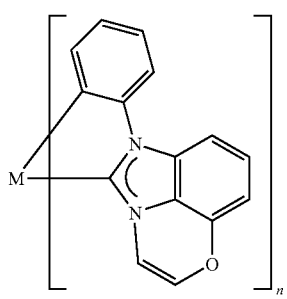
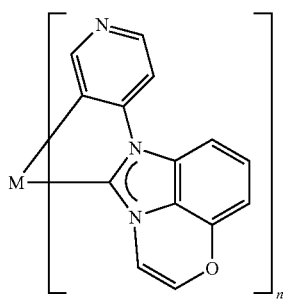
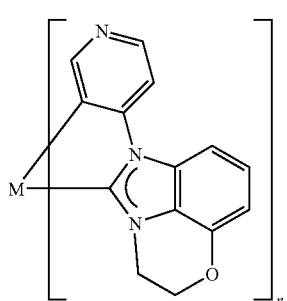
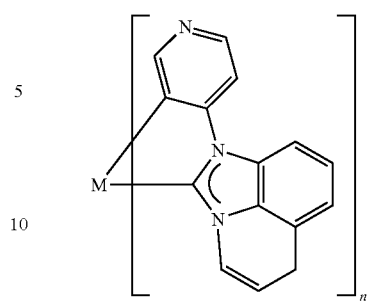
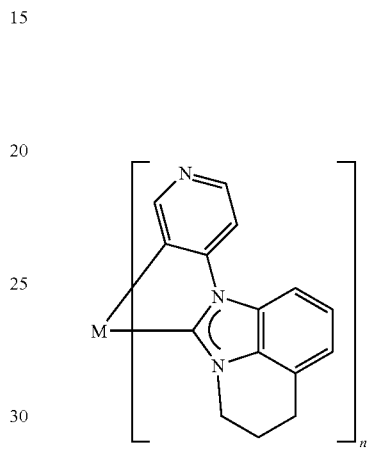

in which M is Ru(III), Rh(III) and especially Ir(III), Pd(II) or Pt(II), n assumes the value of 3 for Ru(III), Rh(III) and Ir(III), and the value of 2 for Pd(II) and Pt(II).

In addition, complexes with different carbene ligands and/or with mono- or dianionic ligands, which may be either mono- or bidentate, are also useful.

With reference to the table which follows, complexes ML'(L")$_2$ with trivalent metal centers and two different carbene ligands L' and L" are specified schematically

| L' | L" | L' | L" | L' | L" | L' | L" |
|---|---|---|---|---|---|---|---|
| $L^1$ | $L^2$ | $L^3$ | $L^4$ | $L^7$ | $L^5$ | $L^5$ | $L^3$ |
| $L^1$ | $L^3$ | $L^3$ | $L^5$ | $L^7$ | $L^4$ | $L^5$ | $L^2$ |
| $L^1$ | $L^4$ | $L^3$ | $L^6$ | $L^7$ | $L^3$ | $L^5$ | $L^1$ |
| $L^1$ | $L^5$ | $L^3$ | $L^7$ | $L^7$ | $L^2$ | $L^4$ | $L^3$ |
| $L^1$ | $L^6$ | $L^4$ | $L^5$ | $L^7$ | $L^1$ | $L^4$ | $L^2$ |
| $L^1$ | $L^7$ | $L^4$ | $L^6$ | $L^6$ | $L^5$ | $L^4$ | $L^1$ |
| $L^2$ | $L^3$ | $L^4$ | $L^7$ | $L^6$ | $L^4$ | $L^3$ | $L^2$ |
| $L^2$ | $L^4$ | $L^5$ | $L^6$ | $L^6$ | $L^3$ | $L^3$ | $L^1$ |
| $L^2$ | $L^5$ | $L^5$ | $L^7$ | $L^6$ | $L^2$ | $L^2$ | $L^1$ |
| $L^2$ | $L^6$ | $L^6$ | $L^7$ | $L^6$ | $L^1$ | | |
| $L^2$ | $L^7$ | $L^7$ | $L^6$ | $L^5$ | $L^4$ | | | where M is, for example, Ru(III), Rh(III) or Ir(III), especially Ir(III), and L' and L" are, for example, ligands selected from the group of ligands $L^1$ to $L^7$ L¹
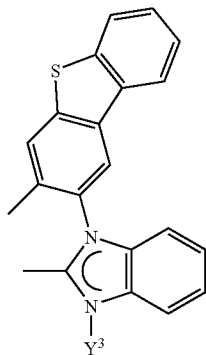

L²
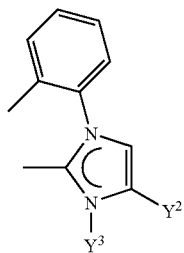

L³
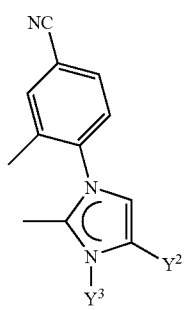

L⁴
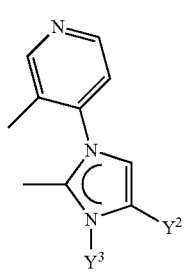

L⁵
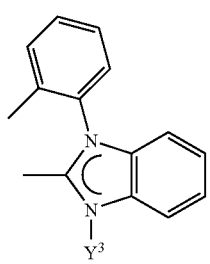

L⁶
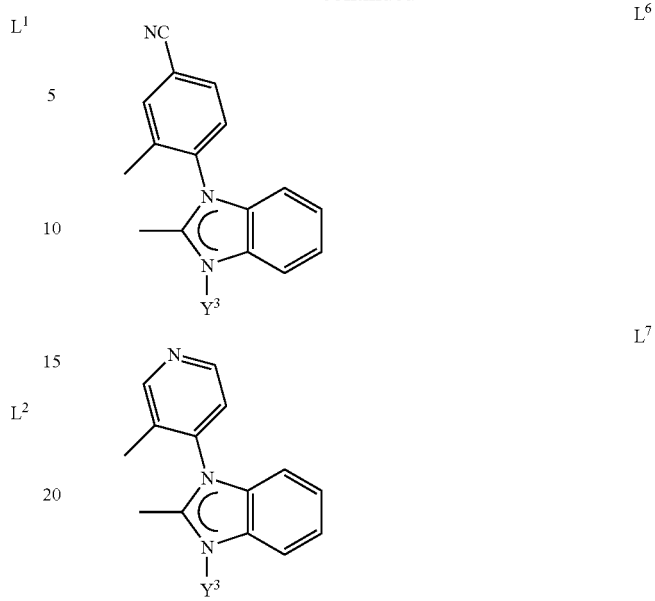

L⁷

$Y^2$ is hydrogen, methyl, ethyl, n-propyl, isopropyl or tert-butyl, and $Y^3$ is methyl, ethyl, n-propyl, isopropyl or tert-butyl.

One representative of these complexes with different carbene ligands (L'=L⁴ when $Y^2$=hydrogen and $Y^3$=methyl; L"=L² when $Y^2$=hydrogen and $Y^3$=methyl) is, for example:

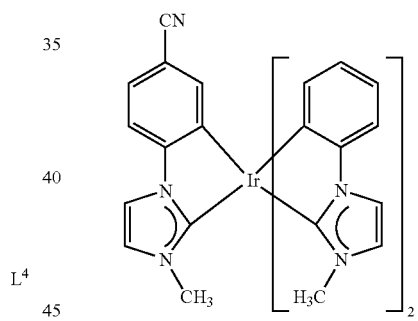

It will be appreciated that, in the complexes of trivalent metal centers (for instance in the case of Ru(III), Rh(III) or Ir(III)) used as emitters in the matrix materials and/or together with the electron blocker materials of the formula I, all three carbene ligands may also be different from one another.

Examples of complexes of trivalent metal centers M with ligands L (here monoanionic bidentate ligand) as "spectator ligands" are LML'L", LM(L')₂ and L₂ML', in which M is, for instance, Ru(III), Rh(III) or Ir(III), especially Ir(III), and L' and L" are each as defined above. For the combination of L' and L" in the complexes LML'L", this gives:

| L' | L" | L' | L" |
|----|----|----|----|
| L¹ | L² | L³ | L⁴ |
| L¹ | L³ | L³ | L⁵ |
| L¹ | L⁴ | L³ | L⁶ |
| L¹ | L⁵ | L³ | L⁷ |

| L' | L" | L' | L" |
|----|----|----|----|
| L¹ | L⁶ | L⁴ | L⁵ |
| L¹ | L⁷ | L⁴ | L⁶ |
| L² | L³ | L⁴ | L⁷ |
| L² | L⁴ | L⁵ | L⁶ |
| L² | L⁵ | L⁵ | L⁷ |
| L² | L⁶ | L⁶ | L⁷ |
| L² | L⁷ |    |    |

Useful ligands L are in particular acetylacetonate and derivatives thereof, picolinate, Schiff bases, amino acids and the bidentate monoanionic ligands specified in WO 02/15645 A1; in particular, acetylacetonate and picolinate are of interest. In the case of the complexes $L_2ML'$, the ligands L may be the same or different.

One representative of these complexes with different carbene ligands (L"=$L^4$ when $Y^2$=hydrogen and $Y^3$=methyl; L"=$L^2$ when $Y^2$=hydrogen and $Y^3$=methyl) is, for example:

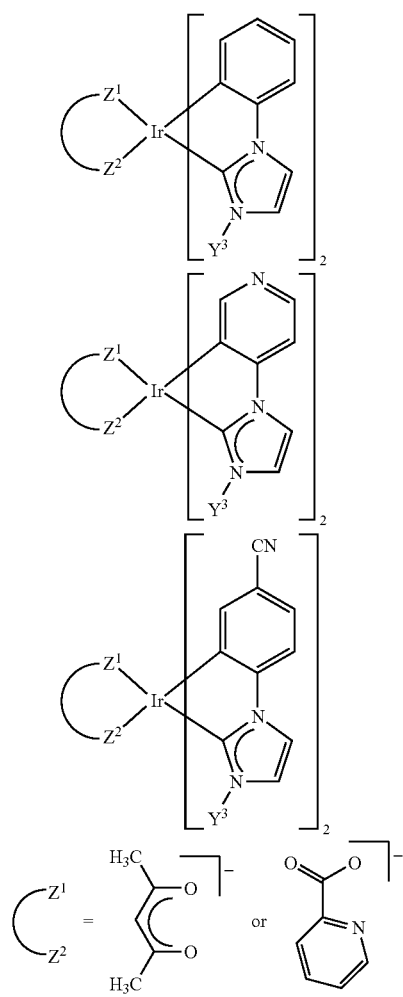

represent the two "teeth" of the ligand L. $Y^3$ is hydrogen, methyl, ethyl, n-propyl, isopropyl or tert-butyl, especially methyl, ethyl, n-propyl or isopropyl.

Further metal complexes suitable especially as emitter compounds for use together with the acridine derivatives of the formula I as matrix materials and/or electron blocker materials in OLEDs are:

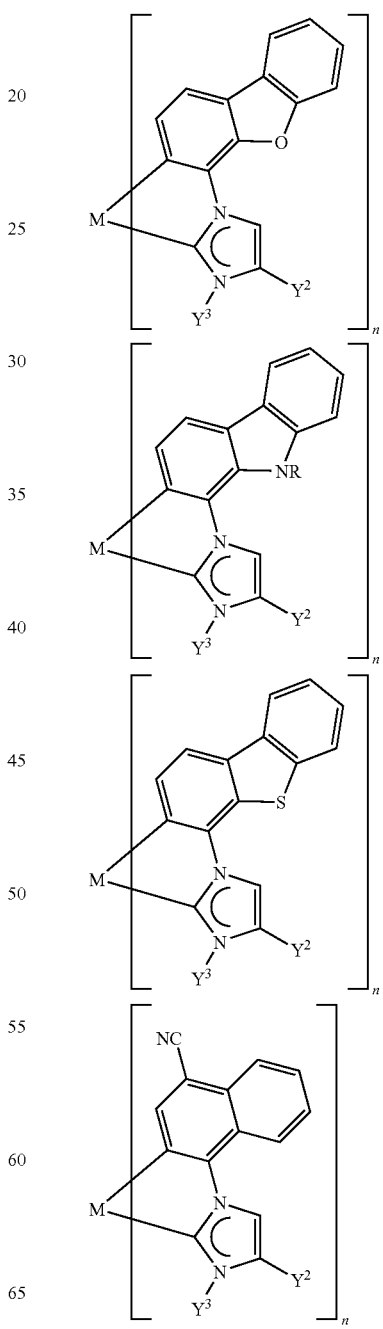

in which $z^1$ and $z^2$ in the symbol

-continued

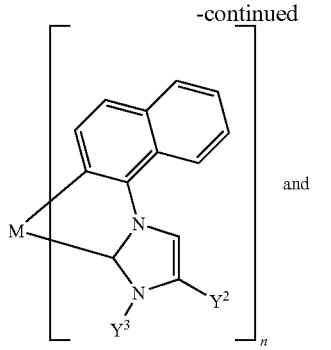

and

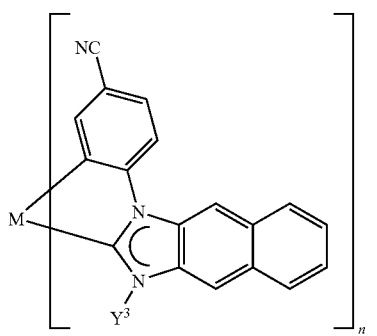

and

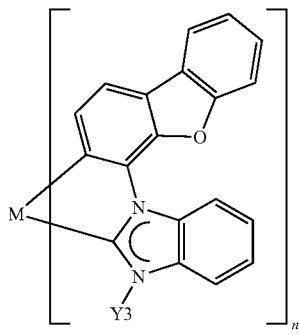

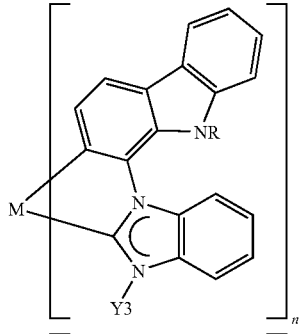

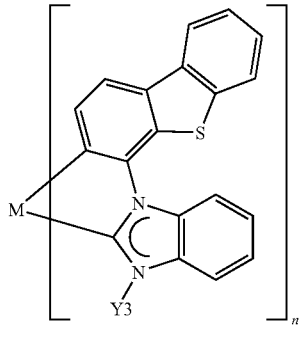

in which M is Ru(III), Rh(III), Ir(III), Pd(II) or Pt(II), n assumes the value of 3 in the case that M is Ru(III), Rh(III) and Ir(III), and assumes the value of 2 in the case that M is Pd(II) and Pt(II), and $Y^2$ and $Y^3$ are each hydrogen, methyl, ethyl, n-propyl, isopropyl or tert-butyl. M is preferably Ir(III) with n equal to 3. $Y^3$ is preferably methyl, ethyl, n-propyl, isopropyl or tert-butyl.

In addition, the following specific metal complexes are suitable for use in OLEDs, especially as emitter compounds, together with the compounds of the formula I as matrix materials:

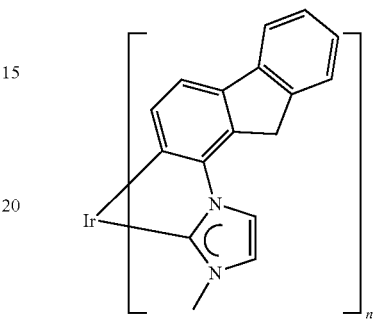

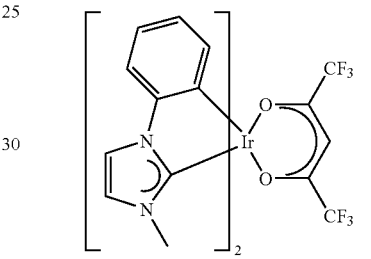

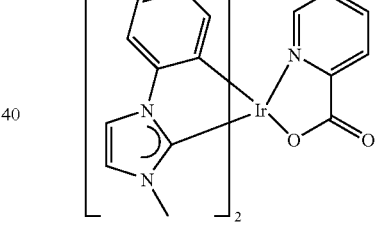

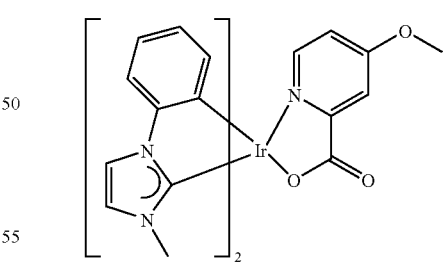

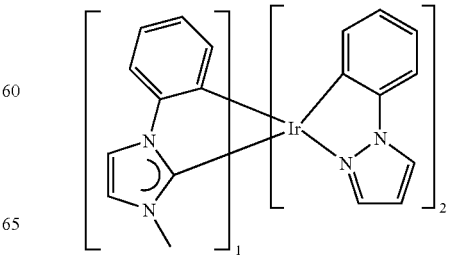

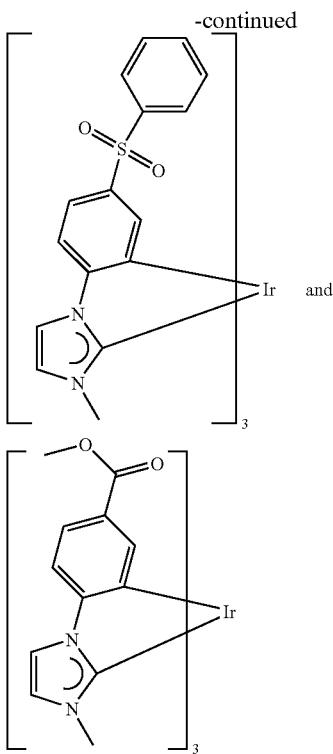

The aforementioned carbene complexes are prepared by processes known to those skilled in the art. The stoichiometries and reaction conditions can be determined without any problem by the person skilled in the art on the basis of the aforementioned patent applications relating to carbene complexes and their preparation processes. In addition, the example part of the present application comprises references to processes for preparing some of the aforementioned carbene complexes. The carbene complexes which are not described explicitly in the examples may be prepared in analogy to the processes described in the example part.

When at least one acridine derivative of the formula (I) is used together with an emitter compound, preferably together with a triplet emitter, more preferably together with a carbene complex as a triplet emitter, in the light-emitting layer of an OLED, the proportion of the at least one acridine derivative of the formula (I) in the light-emitting layer is generally from 50 to 99% by weight, preferably from 60 to 95% by weight, more preferably from 70 to 90% by weight. The proportion of the emitter compound in the light-emitting layer is generally from 1 to 50% by weight, preferably from 5 to 40% by weight, more preferably from 10 to 30% by weight, where the proportions of the at least one acridine derivative of the formula (I) and of the at least one emitter compound generally add up to 100% by weight. However, it is also possible that the light-emitting layer, as well as the at least one acridine derivative of the formula (I) and the at least one emitter compound, comprises further substances, for example further diluent material, suitable diluent material being specified below.

Organic light-emitting diodes (OLEDs) are in principle constructed from several layers, for example:
1. anode
2. hole-transporting layer
3. light-emitting layer
4. electron-transporting layer
5. cathode Layer sequences different from the aforementioned construction are also possible, which are known to those skilled in the art. For example, it is possible that the OLED does not have all of the layers mentioned; for example, an OLED comprising layers (1) (anode), (3) (light-emitting layer) and (5) (cathode) is likewise suitable, the functions of the layers (2) (hole-transporting layer) and (4) (electron-transporting layer) being assumed by the adjacent layers. OLEDs which have the layers (1), (2), (3) and (5) or the layers (1), (3), (4) and (5) are likewise suitable.

The acridine derivatives of the formula I can be used as electron-blocking materials and/or as matrix materials.

The acridine derivatives of the formula I may be present as the sole matrix material—without further additives—in the light-emitting layer. However, it is likewise possible that, in addition to the acridine derivatives of the formula I used in accordance with the invention, further compounds are present in the light-emitting layer. For example, a fluorescent dye may be present in order to modify the emission color of the emitter molecule present. In addition, a dilution material may be used. This dilution material may be a polymer, for example poly(N-vinylcarbazole) or polysilane. However, the dilution material may likewise be a small molecule, for example 4, 4'-N,N'-dicarbazolebiphenyl (CBP=CDP) or tertiary aromatic amines. Where a dilution material is used, the proportion of the compounds of the formula I used in accordance with the invention in the light-emitting layer is generally always still at least 40% by weight, preferably from 50 to 100% by weight, based on the total weight of the compounds of the formula I and diluents.

The individual layers of the OLED among those specified above may in turn be formed from 2 or more layers. For example, the hole-transporting layer may be formed from a layer into which holes are injected from the electrode, and a layer which transports the holes away from the hole-injecting layer into the light-emitting layer. The electron-transporting layer may likewise consist of a plurality of layers, for example a layer in which electrons are injected by the electrode, and a layer which receives electrons from the electron-injecting layer and transports them into the light-emitting layer. These layers are in each case selected according to factors such as energy level, thermal resistance and charge carrier mobility, and also energy difference of the layers mentioned from the organic layers or the metal electrodes. The person skilled in the art is capable of selecting the construction of the OLEDs such that it is matched optimally to the organic compounds used in accordance with the invention as emitter substances.

In order to obtain particularly efficient OLEDs, the HOMO (highest occupied molecular orbital) of the hole-transporting layer should be matched to the work function of the anode, and the LUMO (lowest unoccupied molecular orbital) of the electron-transporting layer should be matched to the work function of the cathode.

The anode (1) is an electrode which provides positive charge carriers. It may be constructed, for example, from materials which comprise a metal, a mixture of different metals, a metal alloy, a metal oxide or a mixture of different metal oxides. Alternatively, the anode may be a conductive polymer. Suitable metals comprise the metals of groups Ib, IVa, Va and VIa of the Periodic Table of the Elements, and the transition metals of group VIIIa. When the anode is to be transparent, generally mixed metal oxides of groups IIb, IIIb and IVb of the Periodic Table of the Elements (old IUPAC version) are used, for example indium tin oxide (ITO). It is likewise possible that the anode (1) comprises an organic material, for example polyaniline, as described, for example, in Nature, Vol. 357, pages 477 to 479 (Jun. 11, 1992). At least either the anode or the cathode should be at least partly transparent in order to be able to emit the light formed.

Suitable hole transport materials for layer (2) of the inventive OLED are disclosed, for example, in Kirk-Othmer Encyclopedia of Chemical Technology, 4th edition, vol. 18, pages 837 to 860, 1996. Both hole-transporting molecules and polymers can be used as hole transport material. Customarily used hole-transporting molecules are selected from the group consisting of tris[N-(1-naphthyl)-N-(phenylamino)]triphenylamine (1-NaphDATA), 4,4'-bis[N-(1-naphthyl)-N-phenylamino]biphenyl (α-NPD), N,N'-diphenyl-N,N'-bis(3-methylphenyl)-[1,1'-biphenyl]-4 (TPD), 1,1-bis[(di-4-tolylamino)phenyl]cyclohexane (TAPC), N,N'-bis(4-methylphenyl)-N,N'-bis(4-ethylphenyl)-[1,1'-(3,3'-dimethyl)biphenyl]-4,4'-diamine (ETPD), tetrakis(3-methylphenyl)-N,N,N',N'-2,5-phenylenediamine (PDA), α-phenyl-4-N,N-diphenylaminostyrene (TPS), p-(diethylamino) benzaldehyde diphenyl hydrazone (DEH), triphenylamine (TPA), bis(4-(N,N-diethylamino)-2-methylphenyl)(4-methylphenyl)methane (MPMP), 1-phenyl-3-[p-(diethylamino) styryl]-5-[p-(diethylamino)phenyl]pyrazoline (PPR or DEASP), 1,2-trans-bis(9H-carbazol-9-Acyclobutane (DCZB), N,N,N',N'-tetrakis(4-methylphenyl)-(1,1'-biphenyl)-4,4'-diamine (TTB), 4,4',4''-tris(N,N-diphenylamino)tri-phenylamine (TDTA), porphyrin compounds and phthalocyanines such as copper phthalocyanines. Customarily used hole-transporting polymers are selected from the group consisting of polyvinylcarbazoles, (phenylmethyl)polysilanes and polyanilines. It is likewise possible to obtain hole-transporting polymers by doping hole-transporting molecules into polymers such as polystyrene and polycarbonate. Suitable hole-transporting molecules are the molecules already mentioned above.

In addition, the carbene complexes mentioned above as emitter materials may also be used as hole transport materials, in which case the band gap of the at least one hole transport material is generally greater than the band gap of the emitter material used. In the context of the present application, band gap is understood to mean the triplet energy.

Suitable electron transport materials for layer (4) of the inventive OLEDs comprise metals chelated with oxinoid compounds, such as tris(8-quinolinolato)aluminum ($Alq_3$), compounds based on phenanthroline, such as 2,9-dimethyl-4,7-diphenyl-1,10-phenanthroline (DDPA=BCP) or 4,7-diphenyl-1,10-phenanthroline (DPA), and azole compounds such as 2,2',2''-(1,3,5-phenylene)tris[1-phenyl-1H-benzimidazole] (TPBI), 2-(4-biphenylyl)-5-(4-t-butylphenyl)-1,3,4-oxadiazole (PBD) and 3-(4-biphenyl)-4-phenyl-5-(4-t-butylphenyl)-1,2,4-triazole (TAZ). The layer (4) may serve either to facilitate electron transport or as a buffer layer or as a barrier layer in order to prevent quenching of the exciton at the interfaces of the layers of the OLED. The layer (4) preferably improves the mobility of the electrons and reduces quenching of the exciton.

Among the materials mentioned above as hole transport materials and electron transport materials, some may fulfill several functions. For example, some of the electron-conducting materials are simultaneously hole-blocking materials when they have a low-lying HOMO.

The charge transport layers may also be electronically doped in order to improve the transport properties of the materials used, in order firstly to make the layer thicknesses more generous (avoidance of pinholes/short circuits) and in order secondly to minimize the operating voltage of the device. For example, the hole transport materials may be doped with electron acceptors; for example, it is possible to dope phthalocyanines or arylamines such as TPD or TDTA with tetrafluorotetracyanquinodimethane (F4-TCNQ). The electron transport materials may, for example, be doped with alkali metals, for example $Alq_3$ with lithium. Electronic doping is known to those skilled in the art and is disclosed, for example, in W. Gao, A. Kahn, J. Appl. Phys., Vol. 94, No. 1, Jul. 1, 2003 (p-doped organic layers); A. G. Werner, F. Li, K. Harada, M. Pfeiffer, T. Fritz, K. Leo. Appl. Phys. Lett., Vol. 82, No. 25, Jun. 23, 2003 and Pfeiffer et al., Organic Electronics 2003, 4, 89-103.

The cathode (5) is an electrode which serves to introduce electrons or negative charge carriers. Suitable materials for the cathode are selected from the group consisting of alkali metals of group Ia, for example Li, Cs, alkaline earth metals of group IIa, for example calcium, barium or magnesium, metals of group IIb of the Periodic Table of the Elements (old IUPAC version), comprising the lanthanides and actinides, for example samarium. In addition, it is also possible to use metals such as aluminum or indium, and combinations of all metals mentioned. In addition, lithium-comprising organometallic compounds or LiF may be applied between the organic layer and the cathode in order to reduce the operating voltage.

The OLED according to the present invention may additionally comprise further layers which are known to those skilled in the art. For example, between the layer (2) and the light-emitting layer (3) may be applied a layer which facilitates the transport of the positive charge and/or matches the band gap of the layers to one another. Alternatively, this further layer may serve as a protective layer. In an analogous manner, additional layers may be present between the light-emitting layer (3) and the layer (4) in order to facilitate the transport of the negative charge and/or to match the band gap between the layers to one another. Alternatively, this layer may serve as a protective layer.

In a preferred embodiment, the inventive OLED comprises, in addition to layers (1) to (5), at least one of the further layers specified below:
 a hole injection layer between the anode (1) and the hole-transporting layer (2);
 a blocking layer for electrons between the hole-transporting layer (2) and the light-emitting layer (3);
 a blocking layer for holes between the light-emitting layer (3) and the electron-transporting layer (4);
 an electron injection layer between the electron-transporting layer (4) and the cathode (5).

However, it is also possible that the OLED does not have all of the layers (1) to (5) mentioned; for example, an OLED comprising layers (1) (anode), (3) (light-emitting layer) and (5) (cathode) is likewise suitable, the functions of layers (2) (hole-transporting layer) and (4) (electron-transporting layer) being assumed by the adjacent layers. OLEDs which have layers (1), (2), (3) and (5) or layers (1), (3), (4) and (5) are likewise suitable.

Those skilled in the art are aware of how suitable materials have to be selected (for example on the basis of electrochemical studies). Suitable materials for the individual layers are known to those skilled in the art and are disclosed, for example, in WO 00/70655.

In addition, each of the layers of the inventive OLED mentioned may be extended from two or more layers. In addition, it is possible that some or all of layers (1), (2), (3), (4) and (5) are surface-treated in order to increase the efficiency of charge carrier transport. The selection of the materials for each of the layers mentioned is preferably determined so as to obtain an OLED with high efficiency and lifetime.

The inventive OLED can be produced by methods known to those skilled in the art. In general, the inventive OLED is produced by successive vapor deposition of the individual layers onto a suitable substrate. Suitable substrates are, for example, glass or polymer films. For the vapor deposition, it is possible to use customary techniques such as thermal evaporation, chemical vapor deposition and others. In an alternative process, the organic layers may be coated from solutions or dispersions in suitable solvents, for which coating techniques known to those skilled in the art are employed.

In general, the different layers have the following thicknesses: anode (1) from 500 to 5000 Å, preferably from 1000 to 2000 Å; hole-transporting layer (2) from 50 to 1000 Å, preferably from 200 to 800 Å, light-emitting layer (3) from 10 to 1000 Å, preferably from 100 to 800 Å, electron-transporting layer (4) from 50 to 1000 Å, preferably from 200 to 800 Å, cathode (5) from 200 to 10 000 Å, preferably from 300 to 5000 Å. The position of the recombination zone of holes and electrons in the inventive OLED and hence the emission spectrum of the OLED can be influenced by the relative thickness of each layer. This means that the thickness of the electron transport layer should preferably be selected such that the electron/hole recombination zone lies in the light-emitting layer. The ratio of the layer thicknesses of the individual layers in the OLED depends on the materials used. The layer thicknesses of any additional layers used are known to those skilled in the art.

By virtue of the inventive use of the acridine derivatives of the formula I as matrix materials in the light-emitting layer of OLEDs, it is possible to obtain OLEDs with high efficiency. The efficiency of the inventive OLEDs can additionally be improved by optimizing the other layers. For example, it is possible to use high-efficiency cathodes such as Ca or Ba, if appropriate in combination with an intermediate layer of LiF. Shaped substrates and novel hole-transporting materials which bring about a reduction in the operating voltage or an increase in the quantum efficiency can likewise be used in the inventive OLEDs. Furthermore, additional layers may be present in the OLEDs in order to adjust the energy level of the different layers and in order to facilitate electroluminescence.

The inventive OLEDs may be used in all devices in which electroluminescence is useful. Suitable devices are preferably selected from stationary and mobile visual display units. Stationary visual display units are, for example, visual display units of computers, televisions, visual display units in printers, kitchen appliances and advertising panels, illuminations and information panels. Mobile visual display units are, for example, visual display units in cellphones, laptops, digital cameras, vehicles, and destination displays on buses and trains.

In addition, the acridine derivatives of the formula I may be used in OLEDs with inverse structure as a matrix material in the light-emitting layer. The construction of inverse OLEDs and the materials used customarily therein are known to those skilled in the art.

The examples which follow provide additional illustration of the invention.

EXAMPLES

A) Process for Preparing Selected Carbene Complexes

Ir(DBF-MIC)₃ (V5)

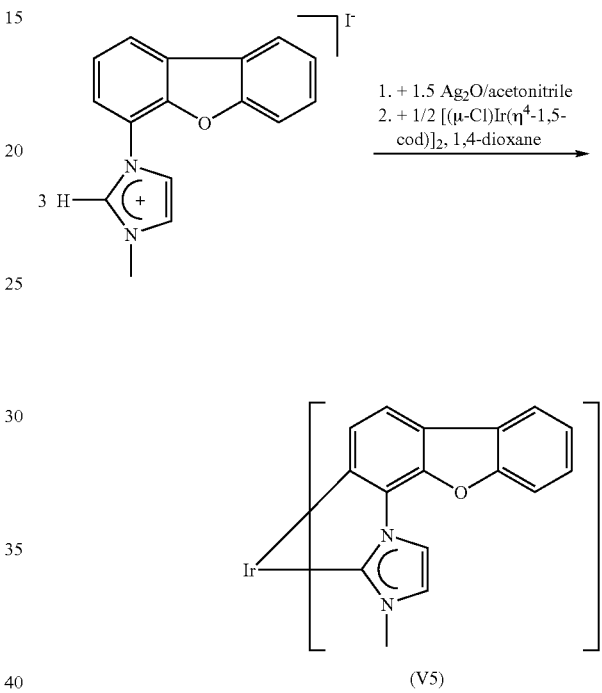

(V5)

3.48 g (9.2 mmol) of imidazolium iodide and 1.07 g (4.6 mmol) of silver oxide are suspended in 60 ml of acetonitrile and stirred at room temperature overnight. Subsequently, the suspension is concentrated to dryness, taken up with 100 ml of 1,4-dioxane and metered into a solution of 0.62 g (0.92 mmol) of $[(\mu\text{-Cl})(\eta^4\text{-1,5-cod})Ir]_2$ and 60 ml of 1,4-dioxane within a half hour. Thereafter, the mixture is stirred at room temperature for one hour, at 70° C. for two hours and under reflux for 18 hours. After cooling, the reaction mixture is concentrated to dryness and extracted with dichloromethane, and the extract is subjected to a column chromatography purification (eluent: 1.2:1 methylene chloride:cyclohexane to isolate the isomer mixture and 2. 1:1 ethyl acetate:cyclohexane to separate the isomers, ratio of the isomers in the reaction mixture:merlfac approx. 3/1). This affords approx. 0.61 g (35%) of mer-isomer and 0.1 g (6%) of fac-isomer as a pale yellow powder.

Meridional Isomer:

¹H-NMR: (DMSO, 500 MHz): 8.40 (d, J=2.0 Hz, 1H, CH), 8.34 (d, J=2.1 Hz, 1H, CH), 8.22 (d, J=2.1 Hz, 1H, CH), 7.90-7.85 (m, 1H, CH), 7.69-7.65 (m, 1H, CH), 7.43-7.13 (m, 16H, CH), 6.75 (d, $^3J_{H,H}$=7.5 Hz, 1H, CH), 6.68 (d, $^3J_{H,H}$=7.7 Hz, 1H, CH), 6.56 (d, $^3J_{H,H}$=7.6 Hz, 1H, CH), 3.13 (s, 3H, CH₃), 3.05 (s, 3H, CH₃), 2.99 (s, 3H, CH₃).

Facial Isomer:

¹H-NMR: (DMSO, 500 MHz): 8.28 (d, J=1.95 Hz, 3H, CH), 7.88-7.89 (m, 3H, CH), 7.67-7.68 (m, 3H, CH), 7.43-7.12 (m, 12H, CH), 6.50 (d, $J_{H,H}$=7.5 Hz, 3H, CH), 3.14 (s, 9H, CH₃).

[(PMIC)₂IrCl]₂ (V6)

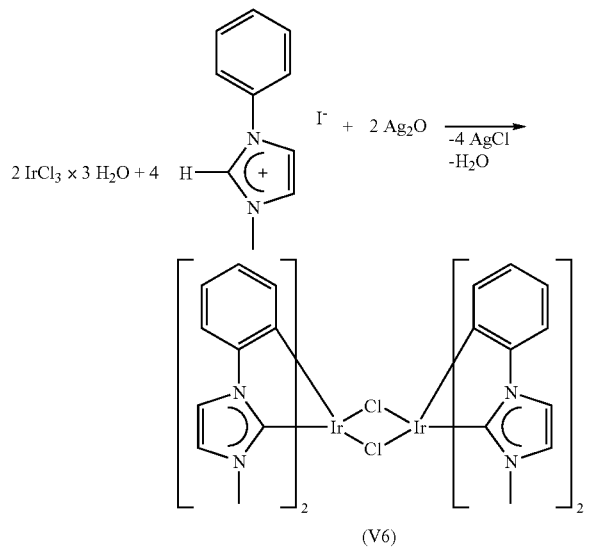

(V6)

4.29 g (18.5 mmol) of silver oxide, 9.47 g (33.1 mmol) of imidazolium iodide and 3.56 g (10.1 mmol) of iridium trichloride trihydrate are suspended in 350 ml of 2-ethoxyethanol and stirred in the dark at 120° C. for 15 h. Thereafter, the solvent is removed under reduced pressure and the residue is extracted with methylene chloride. The extract is concentrated to about a quarter of its volume and admixed with methanol. The precipitated solid is filtered off and dried. This affords 1.7 g of [(PMIC)₂IrCl]₂ (31%).

¹H-NMR: (CD₂Cl₂, 500 MHz): δ=7.59 (d, J=2.3 Hz, 4H, CH), 7.17 (d, J=1.7 Hz, 4H, CH), 6.99 (d, ³$J_{H,H}$=7.2 Hz, 4H, CH), 6.73 (pt, ³$J_{H,H}$=7.5 Hz, 4H, CH), 6.45 (pt, ³$J_{H,H}$=7.9 Hz, 4H, CH), 6.09 (d, ³$J_{H,H}$=7.3 Hz, 4H, CH), 3.91 (s, 12H, CH₃).

(PMIC)₂Irpic (V7)

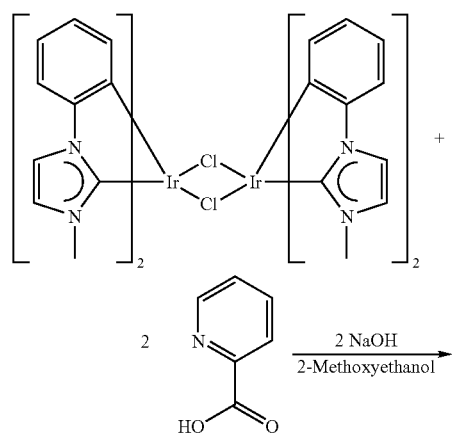

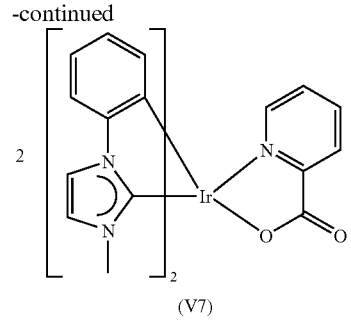

(V7)

A solution of 0.41 g (3.32 mmol) of picolinic acid in methoxyethanol (30 ml) is admixed with 3.32 ml of sodium hydroxide solution (1M, 3.32 mmol) within 10 min and stirred at room temperature for 15 min. Thereafter, the reaction mixture is added to a suspension of 0.9 g (0.83 mmol) of [(PMIC)₂IrCl]₂ in methoxyethanol (80 ml) within 10 min. The mixture is stirred at room temperature for 15 min and then heated at reflux for 21 h. After cooling, the reaction mixture is admixed with water (300 ml). The precipitate formed is filtered off, dried and subjected to column chromatography purification (eluent: ethyl acetate/methanol=1/0.25). This affords 0.64 g of (PMIC)₂IrPic (61%).

¹H-NMR: (CD₂Cl₂, 500 MHz): δ=3.00 (s, 3H, CH₃), 3.86 (s, 3H, CH₃), 6.31-6.33 (m, 1H, CH), 6.42-6.44 (m, 1H, CH), 6.59-6.63 (m, 2H, CH), 6.83-6.88 (m, 2H, CH), 6.90-6.91 (m, 1H, CH), 6.98-6.99 (m, 1H, CH), 7.08 (d, J=7.8 Hz, 2H, CH), 7.21-7.24 (m, 1H, CH), 7.46-7.47 (m, 2H, CH), 7.80-7.83 (dt, J=7.7 Hz, J=1.5 Hz, 1H, CH), 7.92-7.93 (m, 1H, CH), 8.13-8.15 (m, 1H, CH).

(PMIC)₂IrPicOMe (V8)

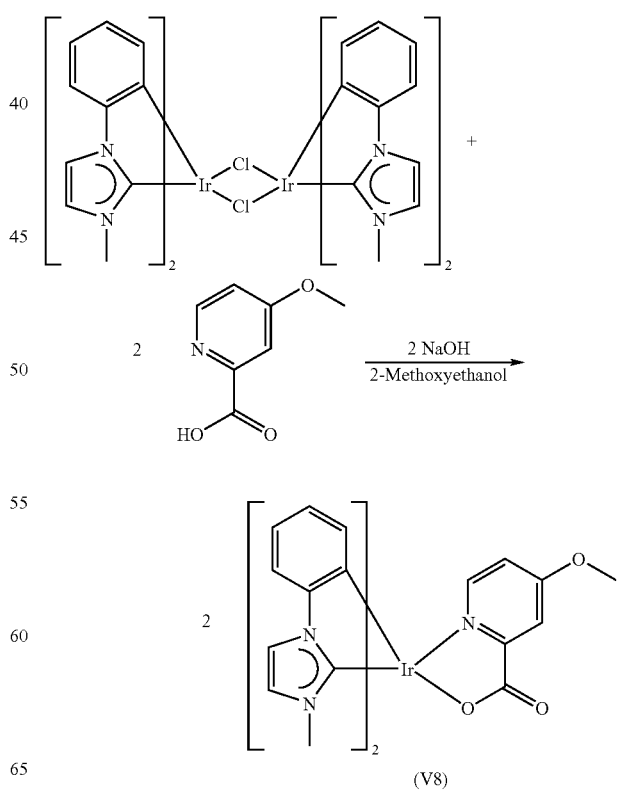

(V8)

A suspension of 0.68 g (4.44 mmol) of 4-methoxypicolinic acid in 70 ml of 2-methoxyethanol is admixed with 4.44 ml of sodium hydroxide solution (1M, 4.44 mmol) within 10 min. The mixture is stirred at room temperature for 15 min, before the mixture is added slowly to a suspension of 1.2 g (1.11 mmol) of [(PMIC)$_2$IrCl]$_2$ and 80 ml of 2-methoxyethanol. The mixture is stirred at room temperature for 15 min and then heated at reflux for 21 h. After cooling, the reaction mixture is admixed with water (600 ml). The precipitate formed is filtered off, dried and purified by column chromatography (eluent: ethyl acetate/methanol=1/0.25). This affords 0.93 g of PMIC$_2$IrPicOMe (64%).

$^1$H-NMR: (CD$_2$Cl$_2$, 500 MHz): δ=3.07 (s, 3H, CH$_3$), 3.85 (s, 3H, CH$_3$), 3.91 (s, 3H, CH$_3$), 6.33 (dd, J=7.3 Hz, J=1.4 Hz, 1H, CH), 6.42 (dd, J=7.4 Hz, J=1.4 Hz, 1H, CH), 6.57-6.61 (m, 2H, CH), 6.74 (dd, J=6.3 Hz, J=2.9 Hz, 1H, CH), 6.81-6.86 (m, 2H, CH), 6.92 (d, J=2.1 Hz, 1H, CH), 6.98 (d, J=2.1 Hz, 1H, CH), 7.07 (dd, J=4.8 Hz, J=1.3 Hz, 1H, CH), 7.08 (dd, J=4.6 Hz, J=1.3 Hz, 1H, CH), 7.46 (dd, J=4.1 Hz, J=2.1 Hz, 2H, CH), 7.65 (d, J=6.2 Hz, 1H, CH), 7.72 (d, J=2.5 Hz, 1H, CH).

(PMIC)$_2$Ir(acac-F$_6$) (V9)

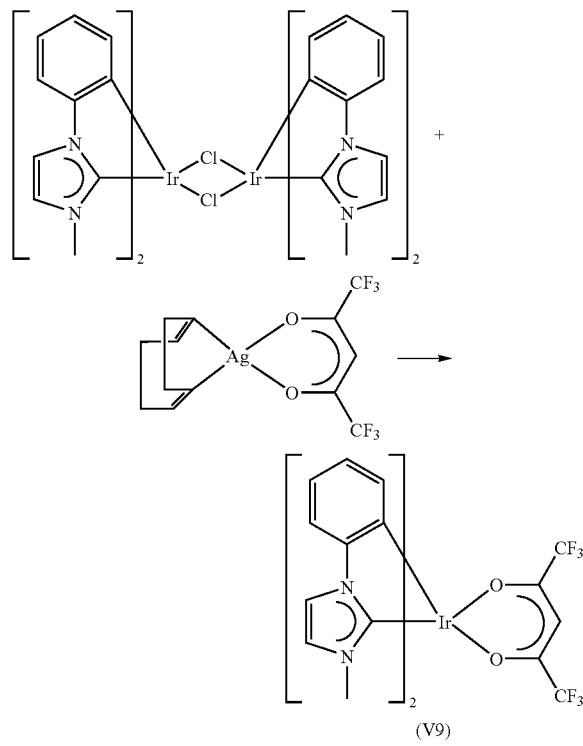

(V9)

A solution of 0.22 g (0.2 mmol) of [(PMIC)$_2$IrCl]$_2$ in 60 ml of methylene chloride was admixed with a solution of 0.17 g (0.4 mmol) of (cod)Ag(acac-F$_6$) in 30 ml of methylene chloride. The mixture was stirred under reflux for 2 h and at room temperature for 18 h. The solvent was then removed under reduced pressure and the residue was purified by column chromatography (eluent CH$_2$Cl$_2$). This afforded 0.28 g (96%) of red powder.

$^1$H-NMR: (CD$_2$Cl$_2$, 500 MHz): δ=7.50 (s, 2H), 7.11 (s, 2H), 7.03 (m, 2H), 6.81 (m, 2H), 6.56 (m, 2H), 6.19 (m, 2H), 5.98 (s, 1H), 3.79 (s, 6H).

mer-Tris-[1-(4'-phenylsulfonylphenyl)-3-methylbenzimidazol-2-ylidene-C2,C2']-iridium(III) (V10)

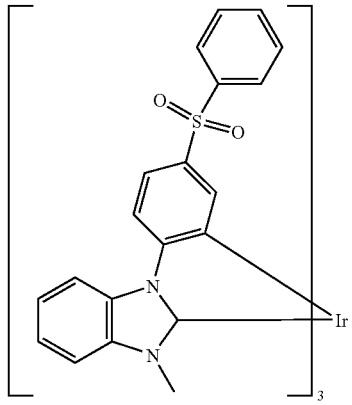

1-(4'-Phenylsulfonylphenyl)benzimidazole

To a solution of benzimidazole (11.8 g, 0.10 mol) in DMF (500 ml), is added, at room temperature under nitrogen, sodium hydride (60% in mineral oil, 4.4 g, 0.11 mol), and the mixture is stirred for 10 min. The mixture is admixed with 4-chlorophenyl phenyl sulfone (26.1 g, 0.10 mol) and stirred at 100° C. for 16 h. After again adding sodium hydride (60% in mineral oil, 2.0 g, 0.05 mol) at room temperature, the mixture is stirred at 130° C. for 16 h. After cooling to room temperature, the mixture is added to ice-water. Precipitated product is filtered off and washed with water. Yield: 91%.

$^1$H-NMR (d$_6$-DMSO, 400 MHz): δ=7.35 (m$_c$, 2H), 7.64-7.82 (m, 5H), 7.98 (d, 2H), 8.06 (d, 2H), 8.20 (d, 2H), 8.67 (s, 1H).

1-(4'-Phenylsulfonylphenyl)-3-methylbenzimidazolium tetrafluoroborate

A solution of 1-(4'-phenylsulfonylphenyl)benzimidazole (6.7 g, 20 mmol) in dichloromethane (100 ml) is admixed at −10° C. with trimethyloxonium tetrafluoroborate (3.3 g, 22 mmol) and stirred under argon for 16 h. After adding ethanol, the precipitate formed is filtered off and washed with cold petroleum ether. Yield: 80%.

$^1$H-NMR (d$_6$-DMSO, 400 MHz): δ=4.17 (s, 3H), 7.67-7.83 (m, 5H), 7.94 (d, 1H), 8.04-8.12 (m, 4H), 8.15 (d, 1H), 8.36 (d, 2H), 10.14 (s, 1H).

mer-Tris-[1-(4'-phenylsulfonylphenyl)-3-methylbenzimidazol-2-ylidene-C2,C2']-iridium(III) (V11)

A suspension of 1-(4'-phenylsulfonylphenyl)-3-methylbenzimidazolium tetrafluoroborate (4.4 g, 10 mmol) in dioxane (100 ml) is admixed under argon at room temperature with KHMDS (0.5 M in toluene, 20 ml, 10 mmol) and stirred for 15 min. After adding (1,5-cyclooctadiene)indium(I) chloride dimer (0.7 g, 1 mmol), the mixture is stirred under reflux for 16 h. After cooling to room temperature, the precipitate is filtered off and washed with methyl tert-butyl ether. The combined filtrates are concentrated to dryness and purified by column chromatography (aluminum oxide, dichloromethane, butanone). Yield: 56%.

$^1$H-NMR (d$_6$-DMSO, 400 MHz): δ=2.82 (s, 3H), 2.99 (s, 3H), 3.15 (s, 3H), 6.61 (d, 1H), 6.98 (d, 1H), 7.01 (d, 1H), 7.30-7.72 (m, 27H), 8.09-8.16 (m, 3H), 8.35-8.44 (m, 3H).

Tris[1-(4'-methoxycarbonylphenyl)-3-methylimidazol-2-ylidene-C2,C2']iridium(III)

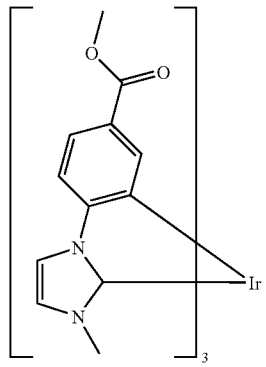

(VII)

1-(4'-methoxycarbonylphenyl)imidazole

A mixture of imidazole (132 g, 1.9 mol), methyl 4-fluorobenzoate (170 ml, 1.3 mol) and potassium carbonate (357 g, 2.6 mol) in DMSO (200 ml) is stirred at 120° C. for 3 h. After cooling to room temperature, the mixture is added to ice-water. Precipitated product is filtered off and washed with water. Yield: 59%.

$^1$H-NMR (d$_6$-DMSO, 400 MHz): δ=3.89 (s, 3H), 7.17 (m$_c$, 1H), 7.86 (d, 2H), 7.90 (m$_c$, 1H), 8.08 (d, 2H), 8.44 (m$_c$, 1H).

1-(4'-methoxycarbonylphenyl)-3-methylimidazolium iodide

A solution of 1-(4'-methoxycarbonylphenyl)imidazole (153 g, 0.76 mol) in 1:1 THF/methanol (600 ml) is admixed with methyl iodide (196 ml, 2.27 mol) and stirred at room temperature under argon for 16 h. After concentration of the solution, the precipitated product is filtered off and washed with THF. Yield: 59%.

$^1$H-NMR (d$_6$-DMSO, 400 MHz): δ=3.90 (s, 3H), 3.95 (s, 3H), 7.94 (d, 2H), 7.98 (m$_c$, 1H), 8.21 (d, 2H), 8.38 (m$_c$, 1H), 9.89 (s, 1H).

Tris-[1-(4'-methoxycarbonylphenyl)-3-methylimidazol-2-ylidene C2,C2']iridium(III)

A suspension of 1-(4'-methoxycarbonylphenyl)-3-methylimidazolium iodide (148.0 g, 431 mmol) and silver (I) oxide (50.4 g, 216 mmol) in dioxane (400 ml) is stirred at room temperature under argon for 16 h. The mixture is admixed with (1,5-cyclooctadiene)-iridium(I) chloride dimer (33.2 g, 43 mmol) and stirred under reflux for 16 h. After cooling to room temperature, the precipitate is filtered off and washed with dichloromethane. The combined filtrates are concentrated to dryness and purified by column chromatography (aluminum oxide, 1:1 ethyl acetate/methanol). Mixed fractions which comprise the product as the mer isomer and fac isomer are concentrated to dryness and dissolved in 1:1 acetone/methanol. The solution is admixed with 1 M hydrochloric acid and stirred under reflux for 16 h. The precipitated mer isomer is filtered off and washed with a little acetone. Yield: 45%.

mer isomer: $^1$H-NMR (d$_6$-DMSO, 400 MHz): δ=2.89 (s, 3H), 2.96 (s, 3H), 2.99 (s, 3H), 3.60 (s, 3H), 3.67 (s, 3H), 3.69 (s, 3H), 7.12 (s, 1H), 7.18 (s, 1H), 7.24 (s, 1H), 7.27 (s, 1H), 7.29 (s, 1H), 7.31 (s, 1H), 7.38-7.49 (m, 6H), 7.98 (s, 1H), 8.04 (s, 1H), 8.06 (s, 1H).

fac isomer: $^1$H-NMR (d$_6$-DMSO, 400 MHz): δ=3.00 (s, 9H), 3.60 (s, 9H), 7.06 (d, 3H), 7.21 (d, 3H), 7.43-7.51 (m, 6H), 7.99 (d, 3H).

Iridium(III) bis[(2-phenyl)-2-pyrazolinato-N,C$^2$)](1-phenyl-3-methylimidazolin-2-ylidene-C,C$^2$ (V12)

Compound (V12) is prepared in analogy to example 3 in US 2005/0260441 A1, with the difference that [(ppz)$_2$IrCl]$_2$ is used instead of [(F2ppz)$_2$IrCl]$_2$.

B) Process for Preparing Illustrative Acridine Derivatives

B1) Synthesis of 9,9-di(4-(N-carbazolyl)phenyl-N-phenyl-9,10-dihydroacridine

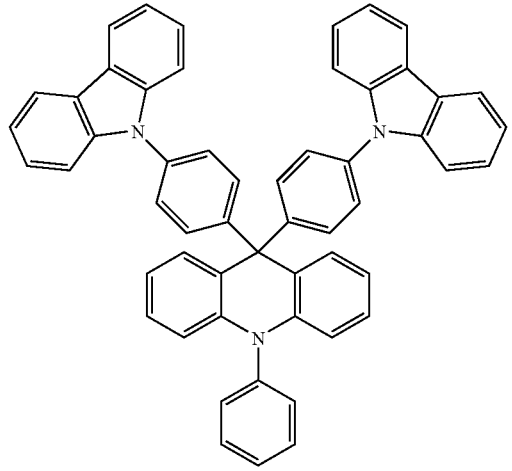 [SMILES: c1ccc(N2c3ccccc3C(c3ccc(-n4c5ccccc5c5ccccc54)cc3)(c3ccc(-n4c5ccccc5c5ccccc54)cc3)c3ccccc32)cc1]

4-Bromophenylcarbazole (2.1 g, 6.6 mmol) are dissolved in THF (24 ml) and admixed at −78° C. with tert-butyllithium (14.5 mmol in hexane). The temperature is raised to −40° C. within 2 hours. The mixture is then admixed with a solution of methyl N,N-diphenylanthranilate (1.0 g, 3.3 mmol) and stirred at room temperature overnight. After chromatographic purification on silica gel, 597 mg of di(4-N-carbazolylphenyl)-(2-(N,N-diphenylamino)phenyl)methanol are obtained.

Di(4-N-carbazolylphenyl)-(2-(N,N-diphenylamino)phenyl)methanol (0.12 g, 0.16 mmol) is dissolved in acetic acid (2 ml) and admixed with concentrated HCl solution (0.1 ml). The mixture is subsequently heated to 100° C. for 1 hour and, after cooling to room temperature, subjected to aqueous workup. After chromatographic purification on silica gel, 99 mg of 9,9-di(4-(N-carbazolyl)phenyl)-N-phenyl-9,10-dihydroacridine are obtained.

$^1$H-NMR (400 MHz, CD$_2$Cl$_2$): δ=6.55 (d, J=8.2 Hz, 2H), 7.02 (dd, J=7.4 Hz, 2H), 7.13-7.26 (m, 7H), 7.29 (dd, J=7.4

Hz, 4H), 7.37 (d, J=8.5 Hz, 4H), 7.44 (dd, J=7.7 Hz, 4H), 7.52-7.58 (m, 8H), 7.59-7.64 (m, 2H), 8.16 (d, J=8.2 Hz, 4H).

UV (PMMA): $\lambda_{max}$=236, 292, 326 (shoulder), 340 (shoulder) nm

Further Examples

Acridine Derivatives

B2) 9,9-Di(3-(N-ethylcarbazolyl)-N-phenyl-9,10-dihydroacridine

The synthesis is effected analogously to the illustrative synthesis according to B1.

$^1$H-NMR (400 MHz, CD$_2$Cl$_2$): δ=1.45 (t, J=7.1 Hz, 6H), 4.39 (q, J=7.1 Hz, 4H), 6.43 (dd, J=8.2, 1.1 Hz, 2H), 6.88 (ddd, J=8.0, 7.1, 1.3 Hz, 2H), 7.02-7.12 (m, 8H), 7.28 (dd, J=8.8, 1.1 Hz, 2H), 7.36 (d, J=8.5 Hz, 2H), 7.39-7.46 (m, 5H), 7.48-7.53 (m, 2H), 7.69 (d, J=1.9 Hz, 2H), 7.81 (ddd, J=7.4, 1.1, 1.1 Hz, 2H).

UV (PMMA): $\lambda_{max}$=240, 270, 301, 350 (shoulder) nm

B3) 9,9-Diphenyl-N-phenyl-9,10-dihydroacridine

The synthesis is effected analogously to the illustrative synthesis according to B1.

$^1$H-NMR (400 MHz, CD$_2$Cl$_2$): δ=6.40 (d, J=8.0 Hz, 2H), 6.83-6.88 (m, 4H), 6.99-7.05 (m, 6H), 7.07-7.10 (m, 2H), 7.22-7.29 (m, 6H), 7.47 (dddd, J=7.5, 7.5, 1.5, 1.5 Hz, 1H), 7.54 (dddd, J=7.5, 7.5, 1.5, 1.5 Hz, 2H).

UV (PMMA): $\lambda_{max}$=234, 294 nm

B4) 9,9-Di(2-methylphenyl)-N-phenyl-9,10-dihydroacridine

The synthesis is effected analogously to the illustrative synthesis according to B1.

$^1$H-NMR (400 MHz, CD$_2$Cl$_2$): δ=1.89 (s, 6H), 6.49 (d, J=8.2 Hz, 2H), 6.58 (d, J=8.2 Hz, 2H), 6.85 (dddd, J=7.4, 7.4, 1.1, 1.1 Hz, 2H), 6.90-6.93 (m, 4H), 7.01-7.08 (m, 4H), 7.15-7.24 (m, 4H), 7.41-7.52 (m, 3H).

UV (PMMA): $\lambda_{max}$=231, 288 nm

B5) 9,9-Di(2,5-difluorophenyl)-N-phenyl-9,10-dihydroacridine

The synthesis is effected analogously to the illustrative synthesis according to B1.

$^1$H-NMR (400 MHz, CD2Cl2): δ6.35 (d, J=8.2 Hz, 2H), 6.78 (dddd, J=8.0, 8.0, 1.3, 1.3 Hz, 2H), 6.81-6.88 (m, 4H), 6.98 (dddd, J=8.5, 7.4, 1.3, 1.3 Hz, 2H), 7.20 (brd, J=8.0 Hz, 2H), 7.24-7.30 (m, 4H), 7.49-7.54 (m, 1H), 7.62 (brdd, J=7.7, 7.7 Hz, 2H).

UV (PMMA): $\lambda_{max}$=236, 280, 324 (shoulder) nm

The invention claimed is:

1. An organic light-emitting diode comprising an acridine derivative of the general formula (I) as matrix material in a light-emitting layer of the organic light-emitting diode and/or as electron blocker in the organic light-emitting diode

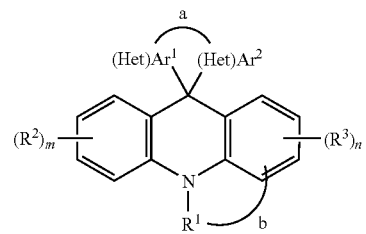

(I)

in which:
(Het)Ar$^1$ and
(Het)Ar$^2$ are each independently an unsubstituted or substituted aryl radical or an unsubstituted or substituted heteroaryl radical;
R$^1$ is an unsubstituted phenyl radical;
R$^2$, R$^3$ are each independently an unsubstituted or substituted alkyl radical which may be linear or branched, an unsubstituted or substituted cycloalkyl radical, an unsubstituted or substituted heterocycloalkyl radical, an unsubstituted or substituted aryl radical, an unsubstituted or substituted heteroaryl radical, or a silyl radical;
n, m are each independently 0, 1, 2, 3 or 4, where, in the case that n or m is 0, all positions in the acridine base skeleton substitutable by R$^2$ or R$^3$ are hydrogen;

is not present; and

is not present.

2. The organic light-emitting diode according to claim 1, wherein the acridine derivatives of the formula (I) are used as matrix materials and/or electron blockers for triplet emitters.

3. The organic light-emitting diode according to claim 1, wherein the (Het)Ar$^1$ and (Het)Ar$^2$ radicals are each independently selected from the group consisting of unsubstituted and substituted C$_6$- to C$_{14}$-aryl radicals and unsubstituted and substituted heteroaryl radicals having from 5 to 14 ring atoms.

4. The organic light-emitting diode according to claim 3, wherein the (Het)Ar$^1$ and (Het)Ar$^2$ radicals are selected from the group consisting of unsubstituted and substituted phenyl, unsubstituted and substituted biphenyl, unsubstituted and substituted pyridyl, unsubstituted and substituted pyrimidyl, unsubstituted and substituted triazinyl, unsubstituted and substituted benzofuryl, unsubstituted and substituted benzothienyl, unsubstituted and substituted benzimidazolyl, unsubstituted and substituted dibenzofuryl, unsubstituted and substituted dibenzothienyl and unsubstituted and substituted carbazolyl.

5. The organic light-emitting diode according to claim 1, wherein the radicals and symbols in the acridine derivatives of the formula (I) are each defined as follows:
(Het)Ar$^1$ and (Het)Ar$^2$ are each independently phenyl which is unsubstituted or substituted by one or more radicals selected from the group consisting of CN, —OC(O)Ph, carbazolyl, pyridyl, CF$_3$,

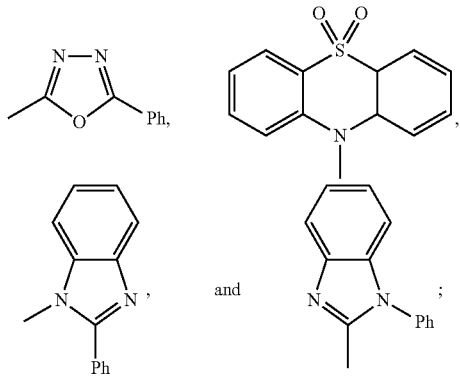

pyridyl, pyrimidyl, triazinyl, oxazolyl, oxadiazolyl, each of which is unsubstituted or substituted by phenyl; benzimidazolyl which is unsubstituted or substituted by phenyl; benzofuryl, dibenzofuryl, benzothienyl, dibenzothienyl, and carbazolyl, each of which is unsubstituted or substituted by phenyl;

R$^1$ is phenyl which is unsubstituted;

n, m are each 0; and $\overbrace{\phantom{xxx}}^{a}$, and $\overbrace{\phantom{xxx}}^{b}$ are not present.

6. The organic light-emitting diode according to claim 1, wherein (Het)Ar$^1$ and (Het)Ar$^2$ in the acridine derivatives of the formula (I) are identical.

7. A light-emitting layer comprising at least one emitter material and at least one matrix material, wherein the matrix material used is at least one acridine derivative of the formula (I) according to claim 1.

8. An organic light-emitting diode comprising at least one light-emitting layer according to claim 7.

9. An organic light-emitting diode comprising at least one acridine derivative of the formula (I) according to claim 1 in a blocking layer for electrons.

10. A device selected from the group consisting of a stationary visual display unit, a mobile visual display unit and an illumination unit, comprising at least one organic light-emitting diode according to claim 8.

11. A device selected from the group consisting of a stationary visual display unit, a mobile visual display unit and an illumination unit, comprising at least one organic light-emitting diode according to claim 9.

* * * * *